(12) United States Patent
Dreeskornfeld et al.

(10) Patent No.: US 7,622,354 B2
(45) Date of Patent: Nov. 24, 2009

(54) INTEGRATED CIRCUIT AND METHOD OF MANUFACTURING AN INTEGRATED CIRCUIT

(75) Inventors: Lars Dreeskornfeld, Dresden (DE); Jessica Hartwich, Dresden (DE); Tobias Mono, Dresden (DE); Arnd Scholz, Dresden (DE); Stefan Slesazeck, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/848,857

(22) Filed: Aug. 31, 2007

(65) Prior Publication Data

US 2009/0057778 A1    Mar. 5, 2009

(51) Int. Cl.
*H01L 21/339* (2006.01)

(52) U.S. Cl. .................. 438/272; 438/276; 257/E21.32

(58) Field of Classification Search ................ 257/288, 257/374; 438/272, 276, 152
See application file for complete search history.

(56) References Cited

U.S. PATENT DOCUMENTS

| 6,867,994 B2 | 3/2005 | Tsukikawa |
| 7,034,408 B1 | 4/2006 | Schloesser |
| 2004/0184298 A1 | 9/2004 | Takahashi et al. |

*Primary Examiner*—Roy K Potter
(74) *Attorney, Agent, or Firm*—Eschweiler & Associates, LLC

(57) ABSTRACT

An integrated circuit including a memory device comprises an array portion comprising memory cells and conductive lines, an upper surface of the conductive lines being disposed beneath a surface of a semiconductor substrate, and a support portion comprising transistors of a first type, the transistors of the first type comprising a first gate electrode including vertical portions that are vertically adjacent to a channel of the transistor of the first type.

10 Claims, 46 Drawing Sheets

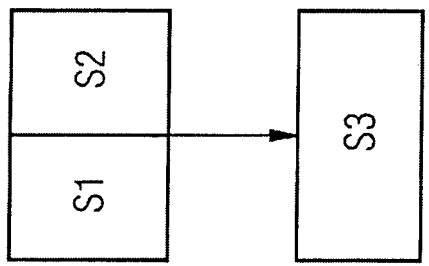
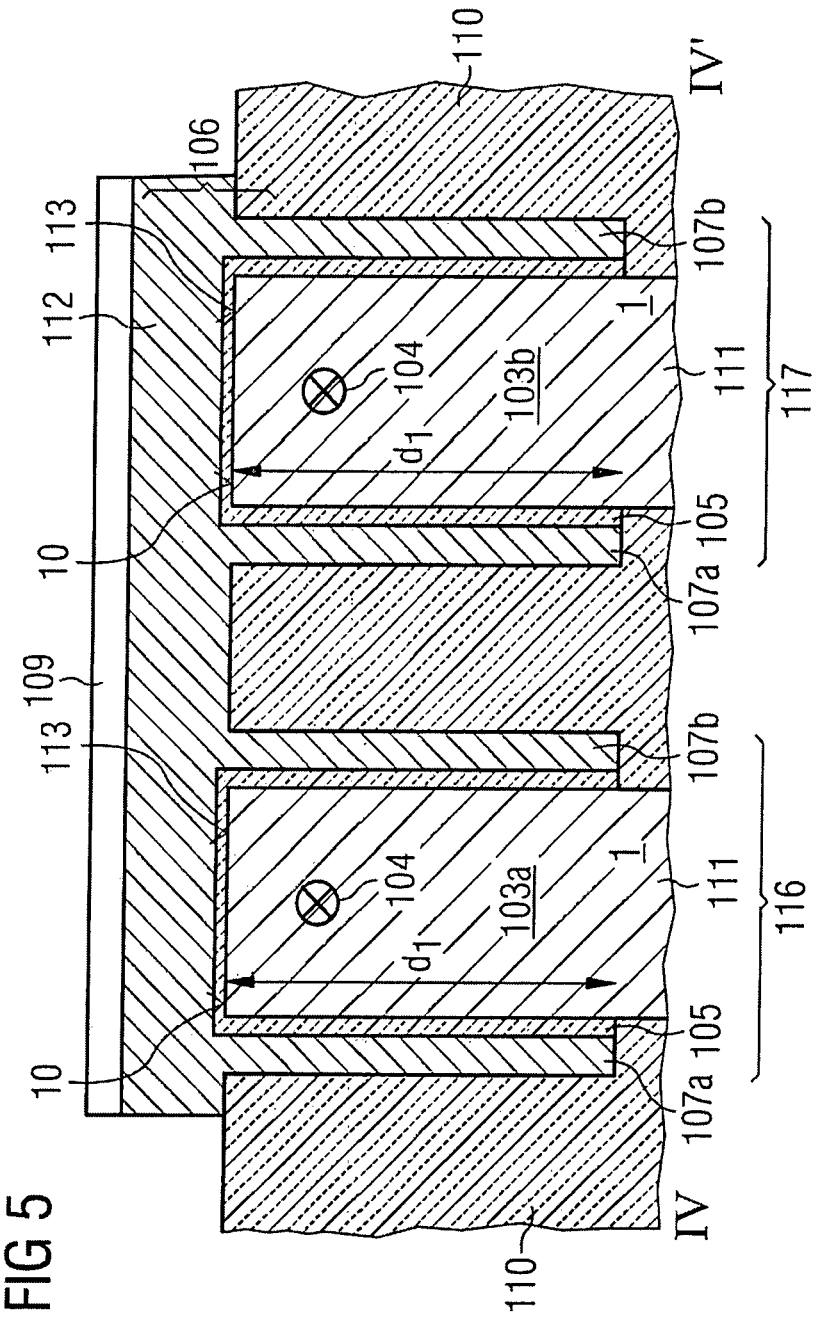

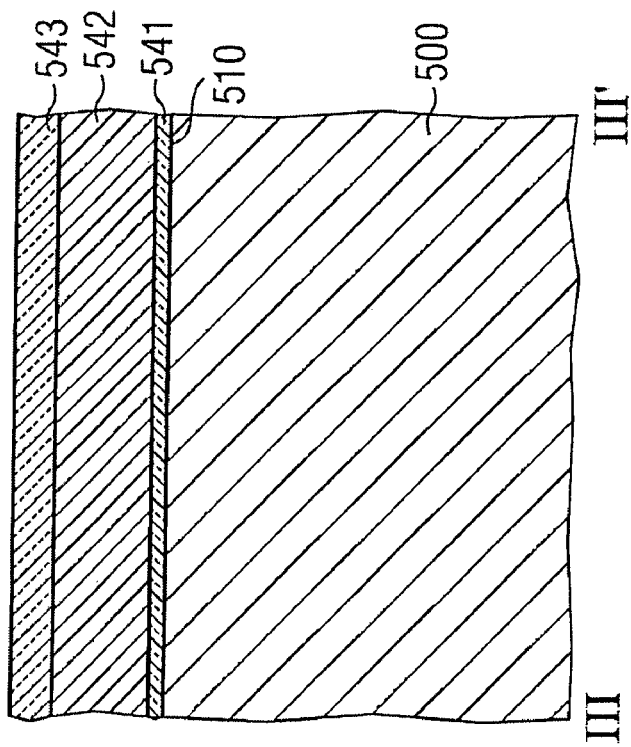
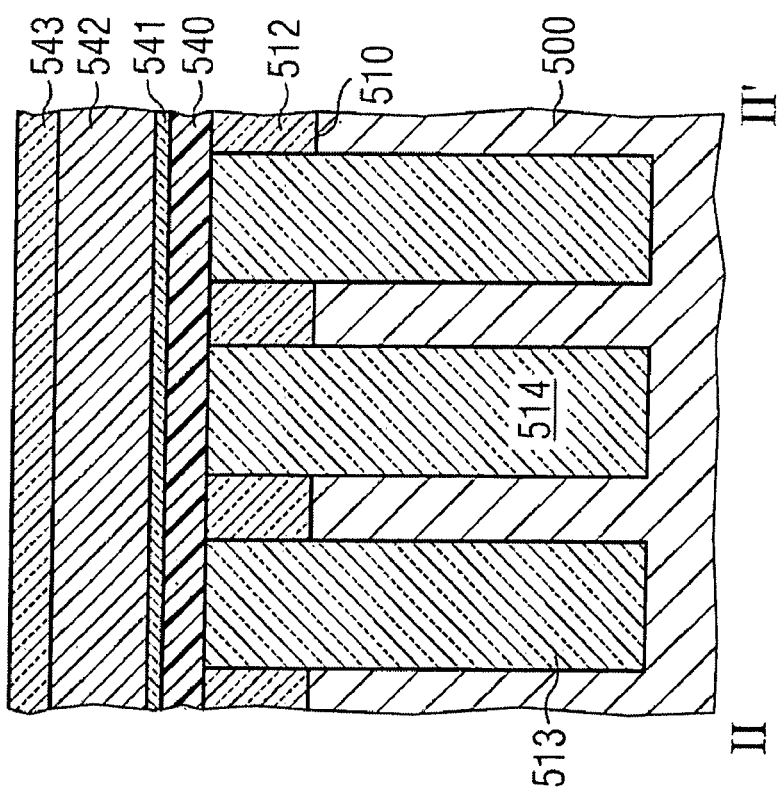

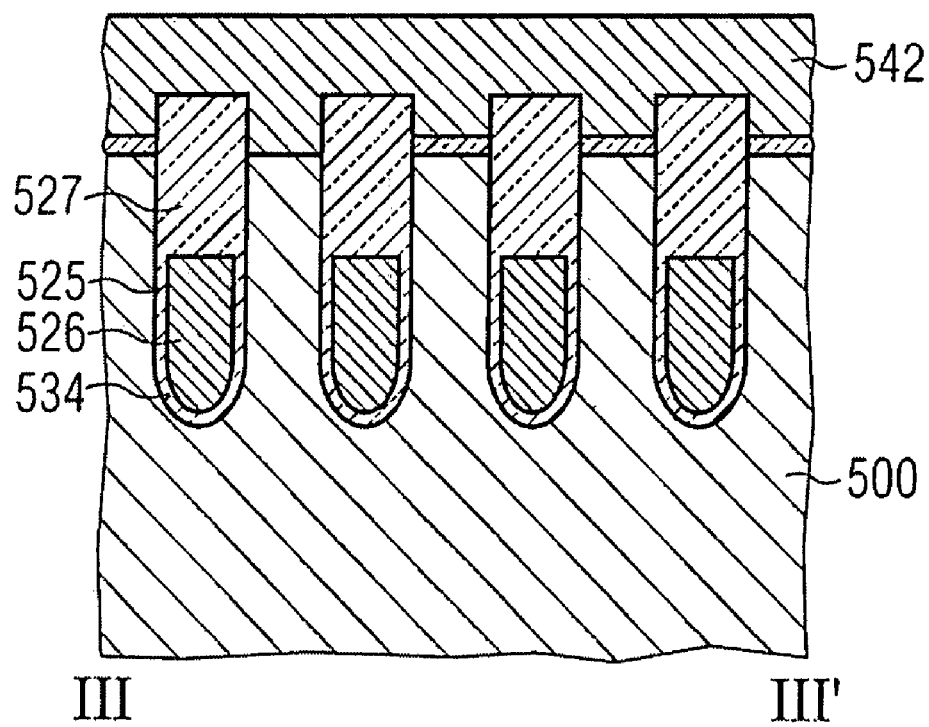

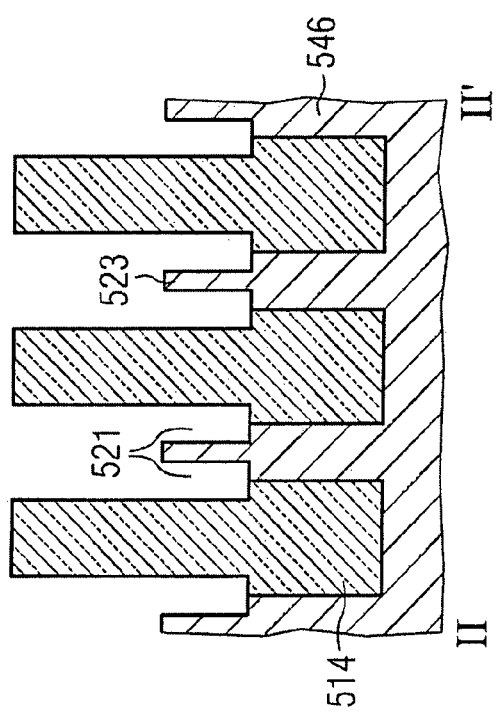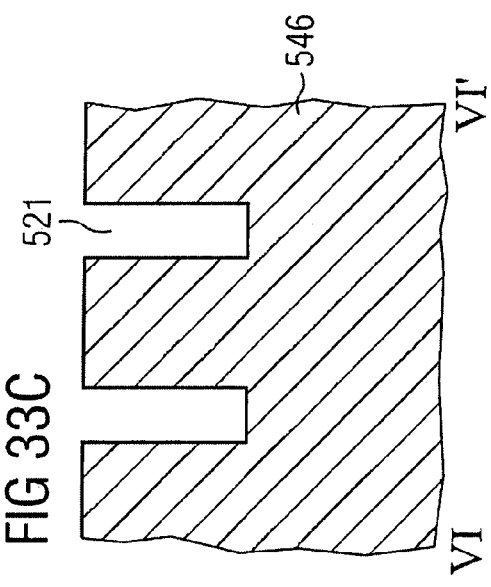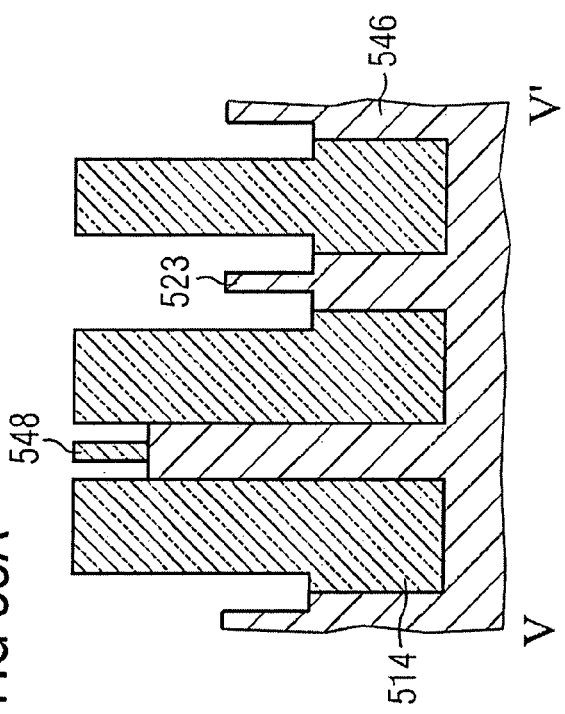

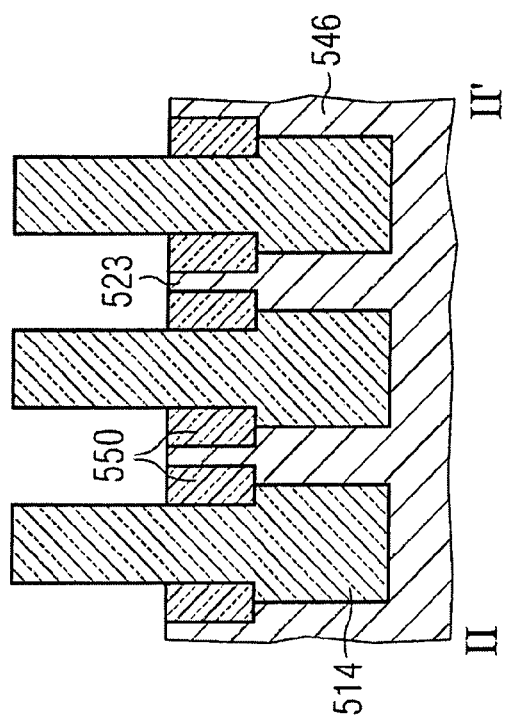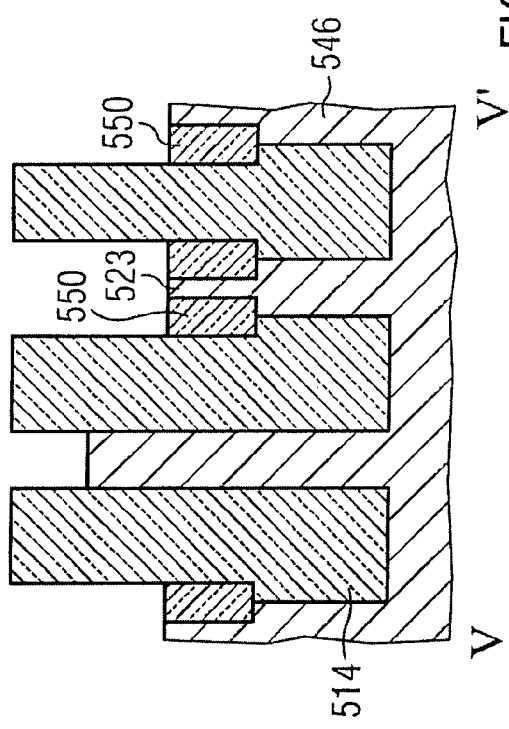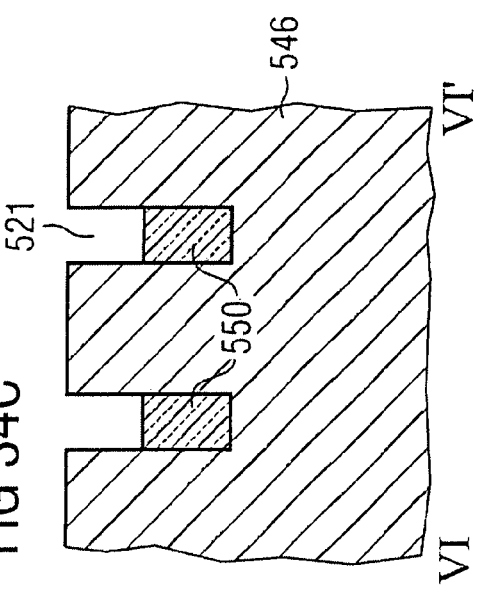

US 7,622,354 B2

INTEGRATED CIRCUIT AND METHOD OF MANUFACTURING AN INTEGRATED CIRCUIT

TECHNICAL FIELD

The present specification relates to an integrated circuit comprising a memory device. Moreover, the specification refers to a method of manufacturing such an integrated circuit.

BACKGROUND

Generally, in the field of semiconductor technologies, many kinds of transistors having different characteristics such as threshold voltage ($V_{TH}$), speed and power consumption are known. Depending on the field of application, a transistor type having a high or low threshold voltage is desired. Moreover, there are several concepts for increasing the channel lengths of the transistor. Further, attempts are made in order to fully deplete a transistor or to increase the channel width of a transistor. Accordingly, an appropriate transistor type can be selected depending on the desired application.

For example, it is often desired to combine too or more transistors having different characteristics on one single chip. In this case, a method might be useful by which transistors having different characteristics and a different structure may be manufactured in the same semiconductor substrate.

BRIEF DESCRIPTION OF THE SEVERAL VIEWS OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 5 shows various views of a multi-channel FinFET;

FIG. 6 illustrates steps of a method according to an embodiment;

FIGS. 8 to 42 show various views of a substrate when performing processing steps according to an embodiment of the method of manufacturing an integrated circuit.

DETAILED DESCRIPTION

In the following detailed description reference is made to the accompanying drawings, which form, a part hereof and in which are illustrated by way of illustration specific embodiments in which the invention may be practiced. In this regard, directional terminology such, as "top", "bottom", "front", "back", "leading", "trailing" etc. is used with reference to the orientation of the Figures being described. Since components of embodiments of the invention can be positioned in a number of different orientations, the directional terminology is used for purposes of illustration, and is in no way limiting. Is to be understood that other embodiments may be utilized and structural or logical changes may be made without departing from the scope defined by the claims.

As will be explained in the following, an integrated circuit including a memory device may comprise an array portion and a support portion. The array portion may comprise memory cells and conductive lines. An upper surface of the conductive lines may be disposed beneath a surface of a semiconductor substrate. Moreover, the support portion may comprise transistors of a first type, the transistors of the first type comprising a first gate electrode including vertical portions that are vertically adjacent to a channel of the transistor of the first type.

Figure 1:
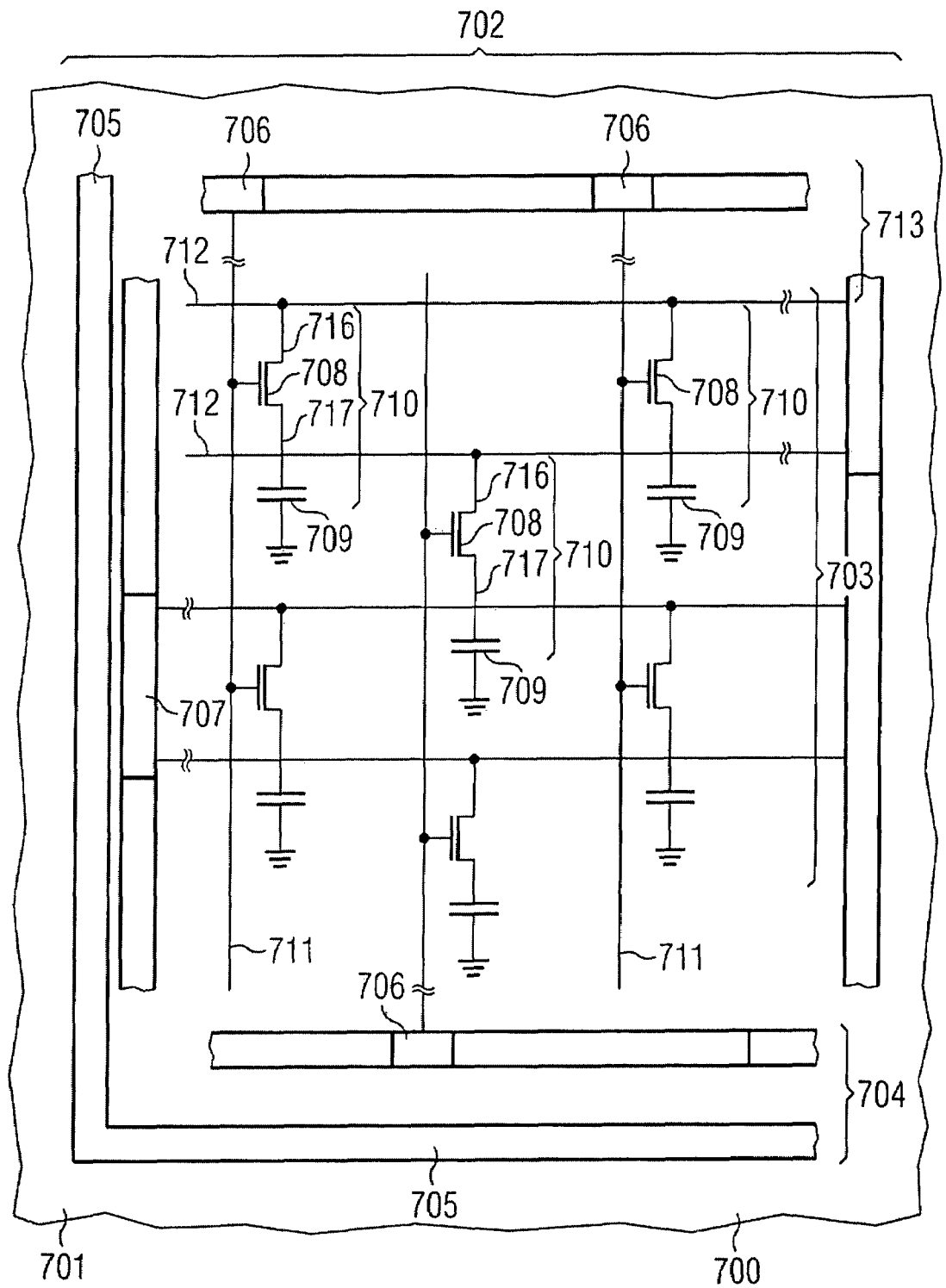
FIG. 1 illustrates a plan view of an exemplary integrated circuit.

FIG. 1 shows a plan view of an exemplary integrated circuit 700 comprising a memory device 702 which may comprise a support portion 704 comprising a transistor of the first type as will be described in the following. The integrated circuit 700 comprising a memory device 702 is formed on a semiconductor substrate, for example, a semiconductor chip 701. The terms "wafer", "substrate", "semiconductor chip" or "semiconductor substrate", used in the context of the present description may include any semiconductor-based structure that has a semiconductor substrate. Wafer and substrate are to be understood to include silicon, silicon-on-insulator (SOI), silicon-on-sapphire (SOS), doped and undoped semiconductors, epitaxial layers of silicon supported by a base semiconductor, and other semiconductor structures. The semiconductor need not be silicon-based. The semiconductor could as well be silicon-germanium, germanium or gallium arsenide. Various components such as, for example semiconductor devices and conductive lines may already be formed in the semiconductor substrate.

The memory device 702 may comprise a memory cell portion 703 as well as a support portion 704. The memory cell array 703 may comprise memory cells 710 as well as corresponding conductive lines. By way of example, word lines 711 may be disposed so as to extend along a first direction, and bit lines 712 may extend in a second direction which intersects the first direction. The memory cells 710 may comprise a storage element 709 such as a storage capacitor as well as an access transistor 708. By way of example, the access transistor 708 may be coupled to the storage element 709 via a node contact 717. Furthermore, the access transistor 708 may be coupled to a corresponding bit line 712 via a corresponding bit line contact 716. The word line 711 may be connected with the gate electrodes of the corresponding access transistors 708. The support portion 704 may comprise a core circuitry 713 as well as a peripheral portion 705. By way of example, the core circuitry 713 may comprise word line drivers 706 as well as sense amplifiers 707. By way of example, a specific word line 711 may be activated by a addressing a corresponding word line driver 706. Accordingly, the information of all the memory cells which are connected with a corresponding word line 711, may be read out via bit lines 712. The signal transmitted by a bit line 712 may be amplified in the sense amplifiers 707. By way of example, the word lines 711 many be implemented as buried word lines wherein a top surface of the word line 711 is disposed beneath the surface of the substrate. The layout and she architecture of the memory cell array may be arbitrary. By way of example, the memory cells may be disposed in a so-called 6 $F^2$-configuration or in any other suitable configuration of memory cells. The storage element 709 may, for example, be a storage capacitor, or a resistive element. According to a further embodiment, the transistor itself or a transistor circuit or transistor combination may be implemented or act as a storage element, For example, the transistor may be implemented as a floating body, transistor which may be adapted to store a charge.

Figure 2B:
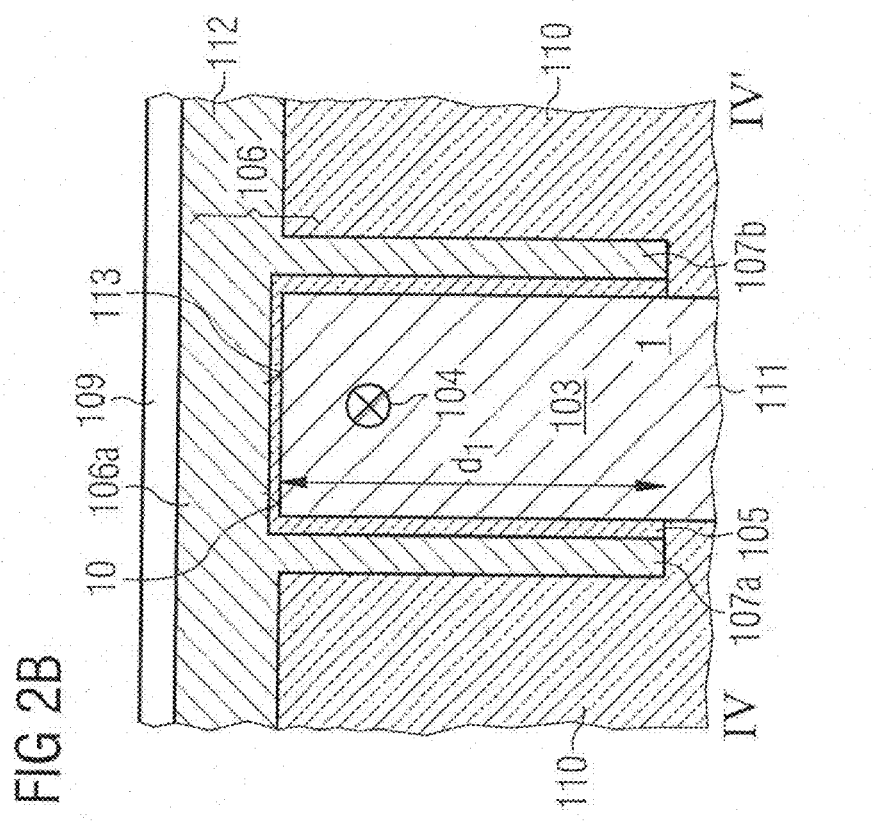
FIGS. 2A to 2O show different cross-sectional views of a transistor of a first type.
Figure 2A:
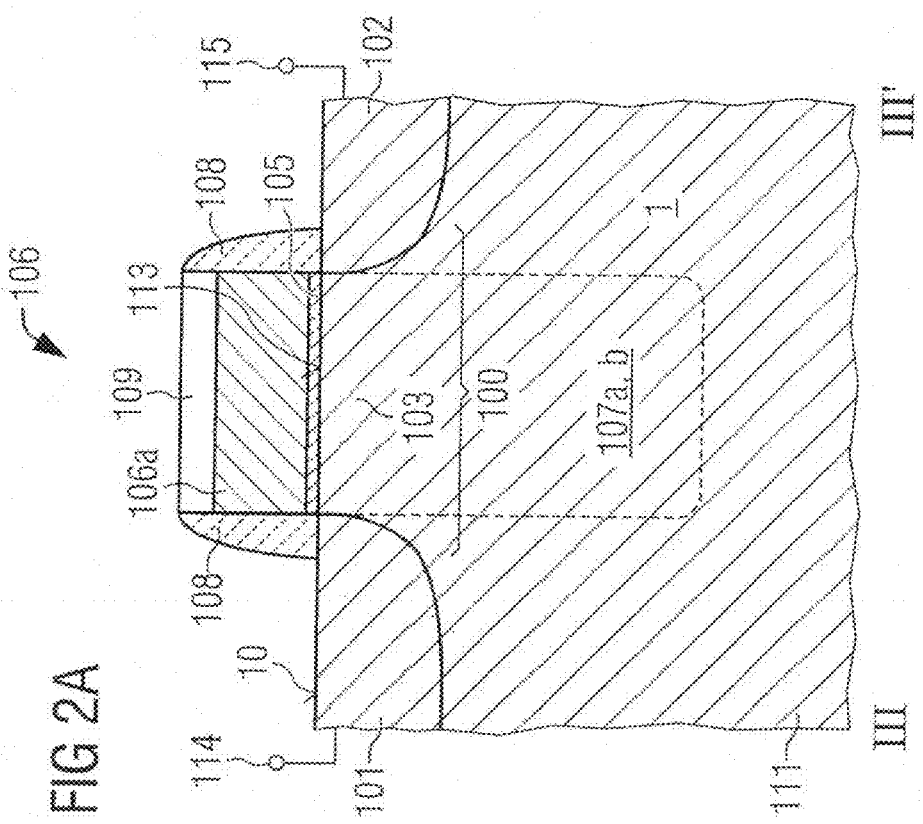

FIG. 2A shows a cross-sectional view of a transistor 100 of a first type which may be disposed in the support portion 704.

In the context of the present specification the term "support portion" refers to a portion of the memory device which is not the array portion comprising an array of memory cells. As has been explained above, the support portion refers to the portion of the memory device in which word line drivers, sense amplifiers, and other devices may be disposed. Nevertheless, as is clearly to be understood, the support portion also comprises any kind of logical and processing circuits which are disposed outside the array portion. By way of example, the integrated circuit may as well be an embedded DRAM device comprising logical circuits. In this case the support portion refers to the part of the memory device in which the logical circuits are disposed. According to embodiments of the invention, transistors of the first type may be disposed in this support portion, for example, in logical, processing or control circuits.

Figure 7A:
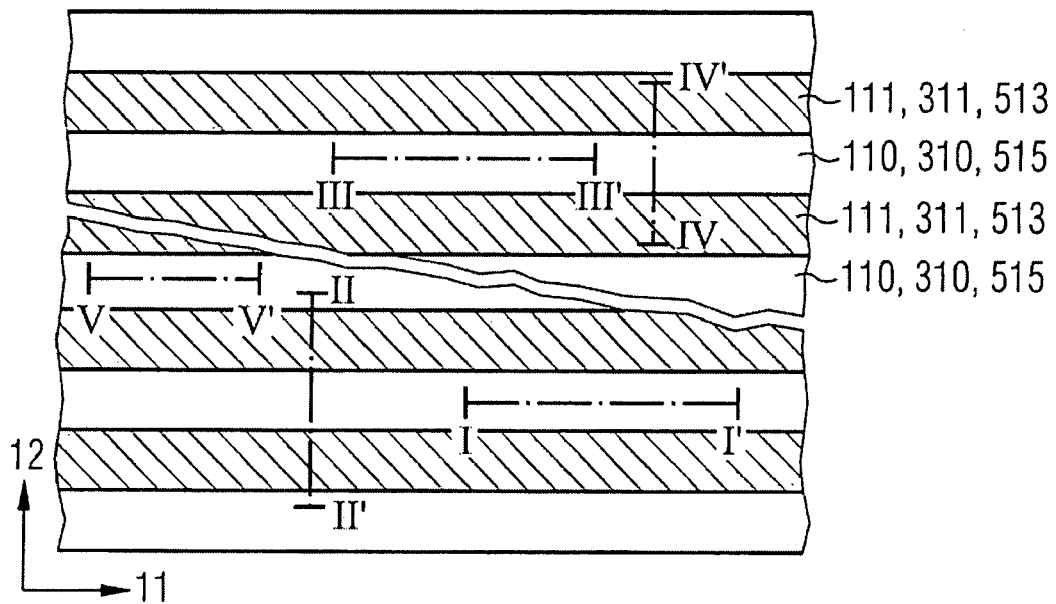
FIGS. 7A and 7B show plan views of an exemplary substrate portion when performing the method according to an embodiment of the invention.
Figure 7B:
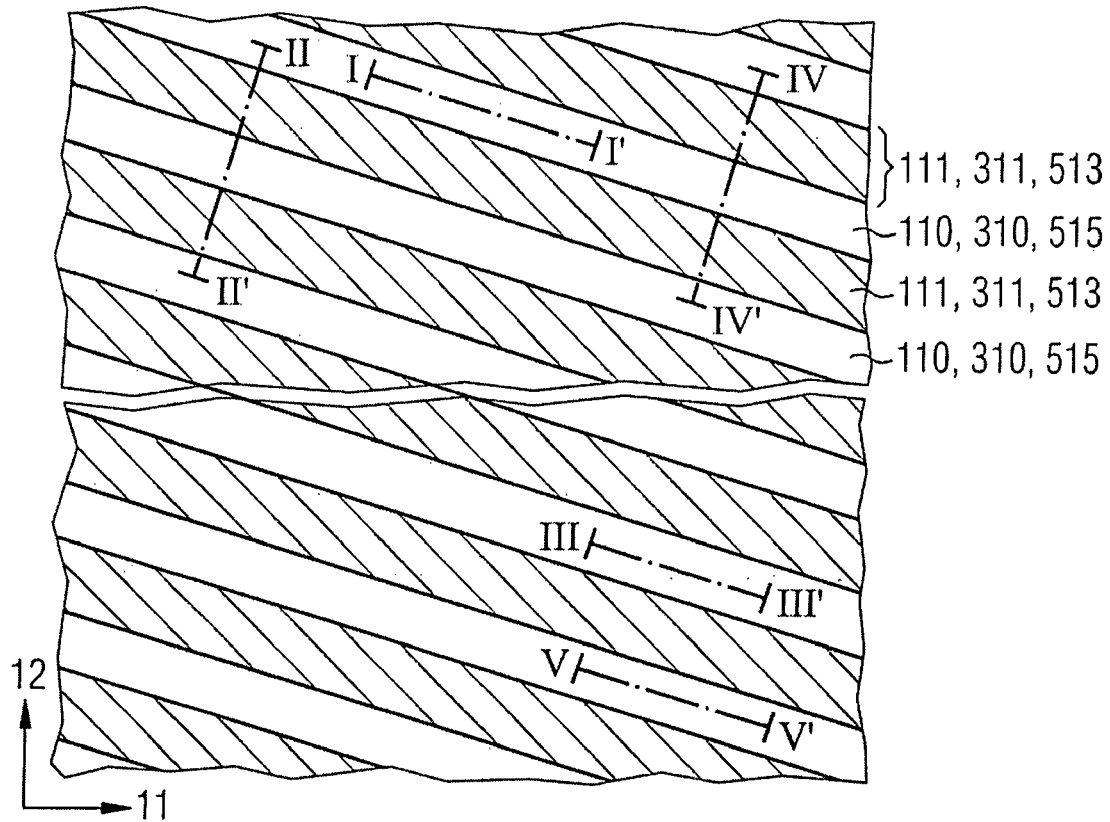

The cross-sectional view of FIG. 2A is taken between III and III' as can be seen from FIGS. 7A and 7B, respectively. The cross-sectional view shown in FIG. 1B is taken between IV and IV' as can be seen from FIGS. 7A and 7B, respectively. As can be seen from FIGS. 2A and 2B, a bottom side of a portion 106A of the gate electrode 106 may be disposed above the surface 10 of the substrate 1. The substrate 1 may be any kind of substrate as has been explained above, for example, an n- or a p-doped silicon substrate. The gate electrode 106 further comprises vertical portions 107a, b, which extend before and behind the drawing plane of FIG. 2A. The transistor 100 further comprises a first and a second doped portions 101, 102. By way of example, the first and the second portions 101, 102 may be p- or n-doped. A channel 103 is formed between the first and the second doped portions 101, 102. The gate electrode 106 is insulated from the channel 103 by the gate dielectric 105. For example, the gate dielectric 105 may be made of any suitable insulating material such as silicon oxide, silicon nitride and others. A cap layer 109 may be disposed on top of the gate electrode 106. Moreover, sidewall spacers 100 may be formed laterally adjacent to the gate electrode 106. The channel 103 extends along the surface 10 of the substrate 1. A first contact region 114 is provided so as to electrically connect the first source/drain portion 101 with a corresponding bitline, for example. Moreover, a second contact region 115 is provided so as to electrically connect the second source/drain portion 102 with a storage element (not illustrated).

A current path between the first and the second contact regions 114, 115 includes the channel 103 as well as the distance from the contact regions 114, 115 to the metallurgical boundary between the source/drain portion 101, 102 and the channel 103.

According to an embodiment, the current path between the first and the second contact regions 114, 115 may only comprise horizontal components, for example, components which extend parallel to the substrate surface.

Figure 2D:
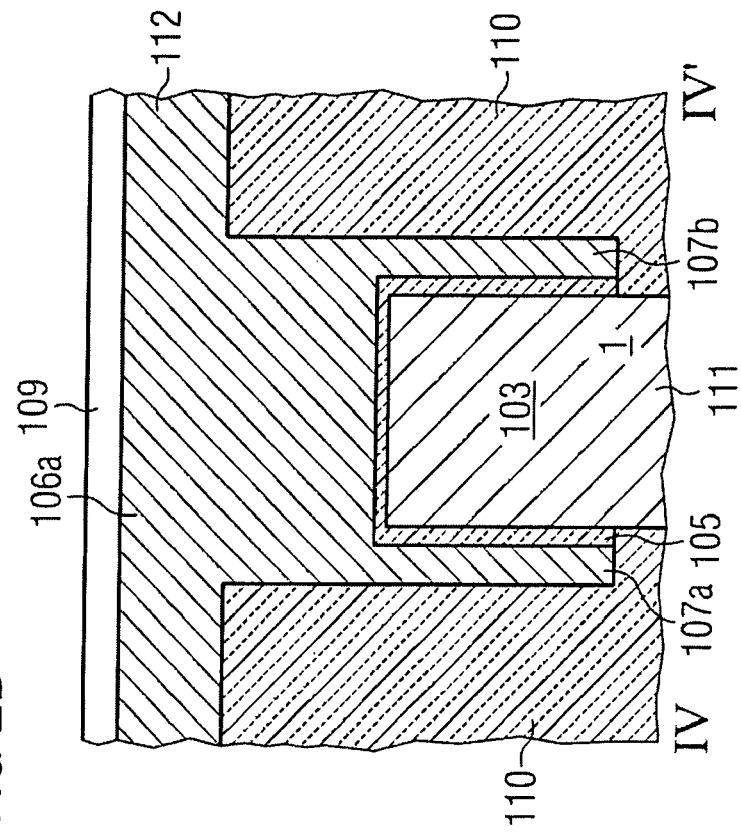
Figure 2C:
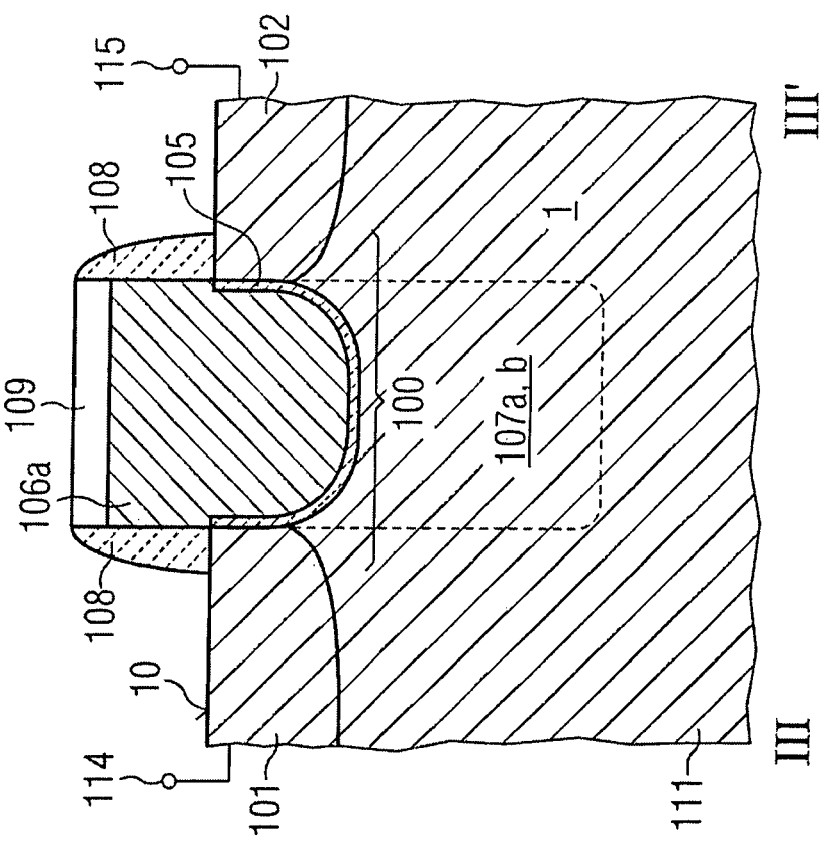

FIG. 2B shows a cross-sectional view which is taken perpendicularly with respect to the cross-sectional view of FIG. 2A. As can be seen, the vertical portions of the gate electrode 107a, 107b laterally enclose the channel 103 so that the channel portion 103 is enclosed at three sides thereof by the gate electrode 106. The gate electrode 106 is insulated from the channel portion 103 by the gate dielectric 105. According to an embodiment, the horizontal portions of the gate dielectric may have a larger thickness than the vertical portions of the gate dielectric 105. As a consequence, the horizontal portion of the gate electrode 106a may have a weaker influence on the conductivity of the channel 103 than the vertical portion. As is shown in FIG. 2B, the vertical portions 107a, 107b may be formed so as to be disposed in the isolation trenches 110. Nevertheless, as will be explained later, the vertical portions 107a, 107b may also extend in the active area 110. The surface 113 of the channel portion 103 is approximately disposed at the same height as the surface 10 of the substrate 1. In this respect, the term "approximately at the same height" means that the top surface 113 of the channel region 103 may be slightly recessed with respect to the surface 10, i.e. by an amount of less than 1 nm. This slight recess may be due to an oxidation step by which the gate dielectric 105 is formed. This oxidation step may consume some of the substrate material so as to slightly recess the surface 113 of the channel 103. According to a further embodiment, the surface 113 of the channel portion 103 may be recessed by an arbitrary amount, for example by etching, as is shorn in FIGS. 2C and 2D.

The transistor shown in FIG. 2 is referred to as a FinFET since the substrate portion, in which the channel is formed, has the shape of a fin or a ridge. Three sides of the fin are enclosed by the gate electrode 106. Accordingly, the FinFET may be fully depleted when the gate electrode 106 is correspondingly activated. Several gate electrodes 100 of adjacent transistors may be connected via the wordlines 112 which may extend perpendicularly with respect to the direction of the active areas and the isolation trenches. Nevertheless, the wordlines 112 may also extend in a direction which is not perpendicular with respect to the direction of the active areas and the isolation trenches.

Figure 3B:
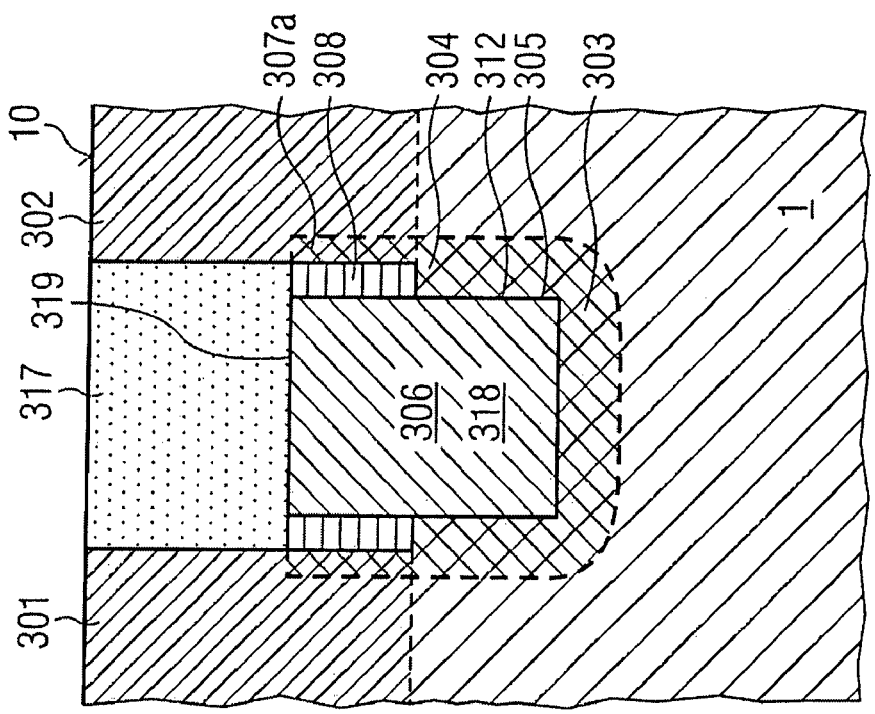
FIG. 3B shows a cross-sectional view of a further transistor.
Figure 3A:
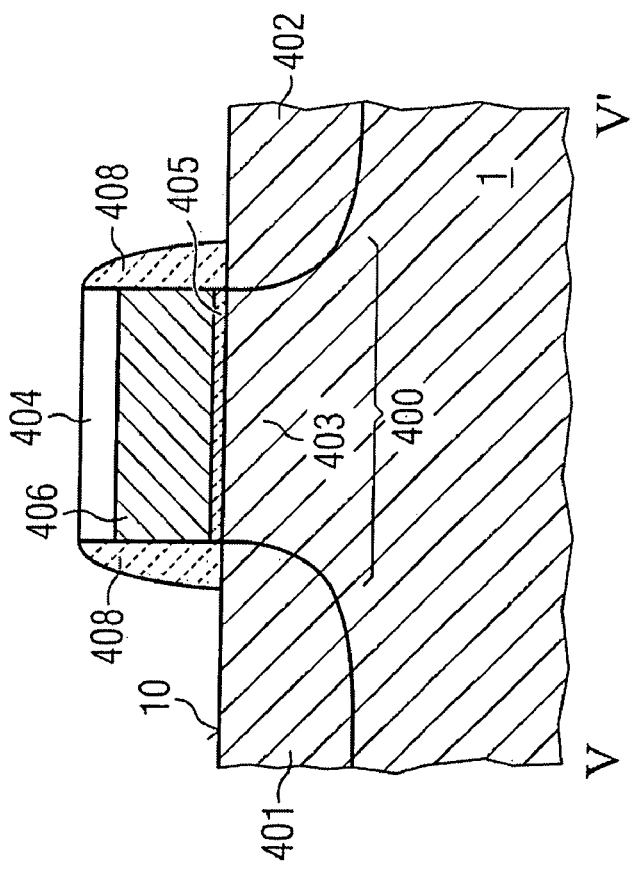
FIG. 3A shows a cross-sectional view of an exemplary planar transistor.

FIG. 3A shows a cross-sectional view of a transistor 400 of a third type which is taken between V and V' as can be seen from FIGS. 7A and 7B, respectively. The transistor 400 shown in FIG. 3A comprises a first and a second source/drain portions 401, 402. The first and second source/drain portions 401, 402 may be formed as doped portions in the substrate 1. The channel 403 is disposed between the first and the second source/drain portions 401, 402. The gate electrode 406 is disposed on top of the substrate surface 10. The gate dielectric 405 is disposed between the gate electrode 406 and the channel 403. A capping layer 404 may be disposed on top of the gate electrode 406. Moreover, sidewall spacers 408 may be laterally adjacent to the gate electrode 406. The top surface of the channel 403 is essentially at the same height as the surface 10 of the substrate 1. The transistor shown in FIG. 2 corresponds to the planar transistor, which is generally well known.

FIG. 3B shows an exemplary cross-sectional view or a conductive line which is disposed in the array portion of the memory device. As can be seen, an upper surface 319 of the conductive line 318 may be disposed beneath the surface 10 of the semiconductor substrate 1. For example, the conductive line may be a word line 711 of the memory cell array 703 as shown in FIG. 1.

The memory cells of the integrated circuit as has been explained above may comprise transistors of a second type, comprising a second gate electrode which is formed in a gate groove that is defined in the semiconductor substrate 1.

Figures 4A, 4B:
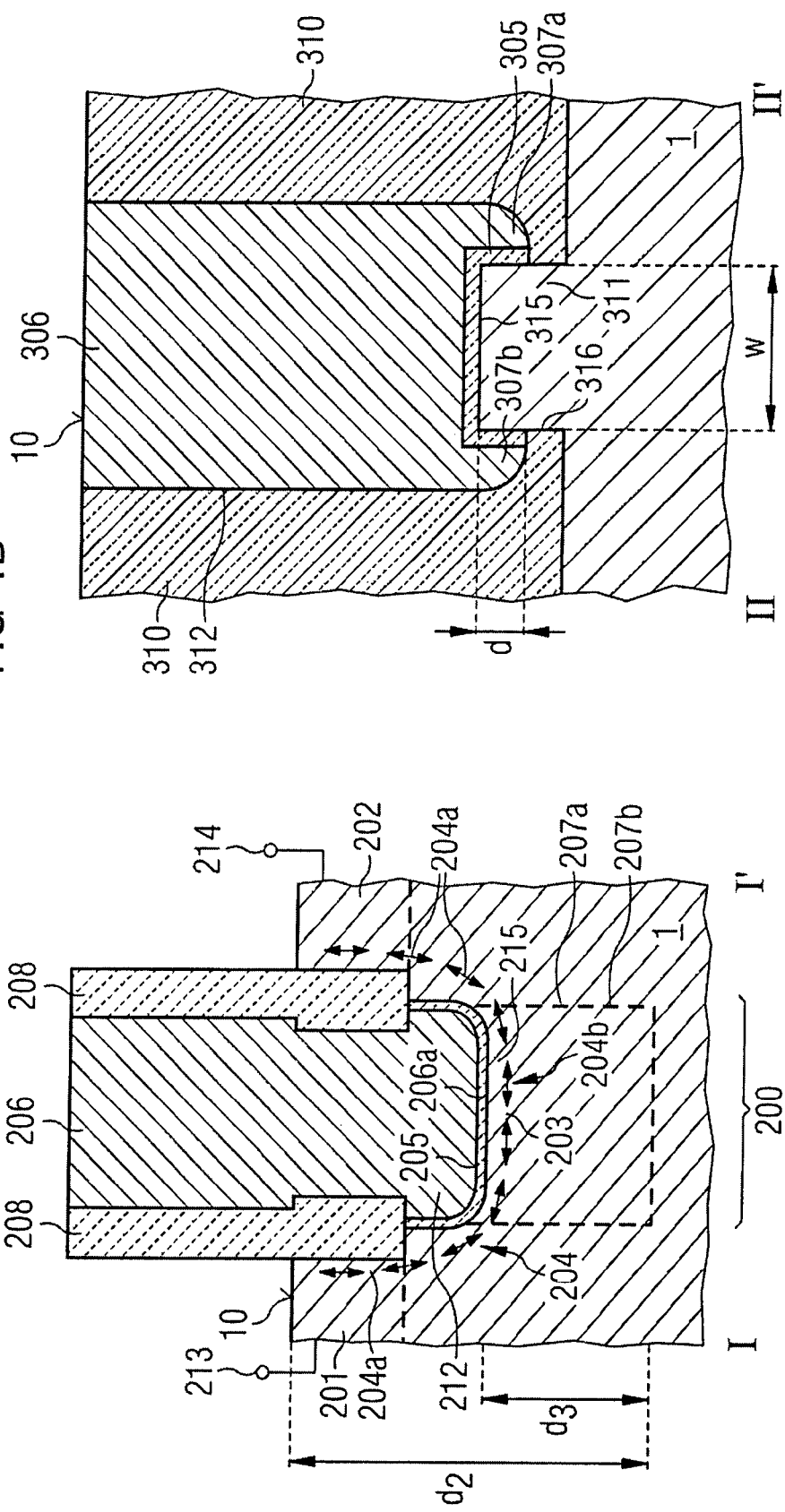
FIGS. 4A and 4B show various views of still a further transistor.

FIGS. 4A and 4B illustrate cross-sectional views of such a transistor of the second type. For example, the cross-sectional view of FIG. 4A may be taken between I and I' or between II and II', respectively. The transistor 200 comprises a first and a second source/drain portions 201, 202 and a channel 203 which is disposed between the first and the second source/drain portions 201, 202. The conductivity of the channel 203 is controlled by the gate electrode 206.

The first and the second source/drain portions 201, 202 are disposed in the surface region of the semiconductor substrate 1. The gate electrode 206 is disposed in a gate groove 212. According to an embodiment, the gate electrode 206 nay further comprise two vertical portions 207a, b. Accordingly, the active area 211 has the shape of a fin or a ridge and three sides of the fin may be enclosed by the gate electrode 206. The gate groove 212 is etched in the substrate surface 10. Accordingly, a top portion 215 of the active area 211 is disposed below the surface 10 of the semiconductor substrate 1. Moreover, the bottom side of the central portion 206A of the gate electrode is disposed below the substrate surface 10. The vertical portions 207a, b may extend in a plane which lies before and behind the depleted cross-section and therefore are illustrated with broken lines in FIG. 4A. The gate electrode 206 is insulated from the channel 203 by the gate dielectric 205. A sidewall spacer 208 having a thickness which is larger than the thickness of the gate dielectric 205 may be disposed between the gate electrode 206 and the first and the second source/drain portions 201, 202, respectively. By way of example, the sidewall spacer 208 may be made of silicon nitride. A first contact region 213 is provided so as to electrically connect the first source/drain portion 201 with a corresponding bitline, for example. Moreover, a second contact region 214 is provided so as to electrically connect the second source/drain portion 202 with a storage element (not illustrated).

The gate electrode 206 may be made of any conductive material, for example, polysilicon. The first and second source/drain portions 201, 202 may be implemented as normally or heavily doped silicon regions and, consequently, exhibit an excellent electrical conductivity. The channel 203 is lightly p-doped or lightly n-doped and therefore insulates the first from the second source/drain portions unless a suitable voltage is applied to the gate electrode 206.

A current path between the first and the second contact regions 213, 214 may include a first component 204A which extends in a first vertical direction, for example, downwards, a second component 204b which extends in a horizontal direction, and a third component 204A extending upwards, in a vertical direction which is opposite to the first vertical direction. Differently stated, the current path includes the channel 203 as well as the distance from the contact, regions 213, 214 to the metallurgical boundary between the source/drain portion 201, 202 and the channel.

According to an embodiment, as is shown in FIG. 4B, the vertical portions 304a, b of the gate electrode may extend slightly deeper into the substrate than the gate groove 312. For example the vertical portions 307a, b extend to a depth of approximately less than 25 nm measured from the bottom portion of the gate groove 321 which is formed in the substrate material. Differently speaking, the depth d corresponds to the depth of the vertical portions 307a, b being measured from the top surface 315 of the fin-like portion. Moreover, the channel which is adjacent to the gate electrode 306 may be narrowed with respect to the active area which is defined by forming the isolation trenches 310. According to a further embodiment, the substrate portion, in which the channel is formed, may not be narrowed. Accordingly, when applying a typical gate voltage, the channel may not be fully depleted. Nevertheless, as can for example be taken from FIG. 4B, the resulting transistor 300 has an increased channel width in comparison with the conventional recessed channel transistor.

For example, a transistor of a third type may be disposed in the support portion. The transistor of the third type is referred to as a so-called multi channel finFet. FIG. 5 shows a cross-sectional view of such a multi channel FinFet. As can be seen from FIG. 5, one single gate electrode 106 may be in contact with two different transistors 116 and 117. Accordingly, the single gate electrode 106 is adapted to control a current flow in the channel 103a of the first transistor and 103b of the second transistor. Accordingly, by applying one single gate voltage, a signal may be obtained from the transistor which corresponds to a larger current flow. Moreover, an arbitrary width of the channel nay be set, independent from the specific depth of the vertical portions of the transistors.

In the following, an exemplary embodiment of the method of manufacturing an integrated circuit will be described.

As is shown in the flow-chart of FIG. 6 illustrating the method according to an embodiment, a method of manufacturing an integrated circuit including a memory device may comprise defining an array portion comprising providing memory cells (S1) and forming conductive lines (S2) and defining a support portion comprising forming transistor of a first type (S3), wherein forming the conductive lines comprises defining grooves in a semiconductor substrate and filling the grooves with conductive material and wherein forming transistors of the first type comprises defining vertical portions that are vertically adjacent to a channel of the transistor of the first type.

Providing memory cells and forming conductive lines may be performed simultaneously or subsequently in an arbitrary succession. Moreover, forming the transistor of the first type may be performed before or after providing the memory cells or forming conductive lines. Moreover, the transistors of the first, second and third type may be formed using the same processing steps. During those processing stops, the depth of the vertical portions of the gate electrodes may be arbitrarily chosen. For example, the vertical portions may have the same depth or different depths.

FIGS. 7A and 7B show exemplary plan views of a substrate which may be used when performing the method according to an embodiment of the invention. As can be seen, active areas 110, 310, 515 are defined. For example, the active areas may be defined by forming isolation trenches 111, 311, 513 and filling the isolation trenches with an appropriate insulating material. By way of example, the width of the isolation trenches may be equal to the minimal structural feature site F, which may be obtained by the technology employed, or a fraction thereof. Likewise, the width of the active areas may be F or a fraction thereof, for example F/2, F/3, F/4 and the like. By way of example, F may be 120 nm, 100 nm, 75 nm, 65 nm, 55 nm or less than 40 nm. Various components or doped portions may be already formed in the semiconductor substrate. For example, isolation structures may be defined in each of the active area lines so as to form single active area segments. By way of example, the isolation structure may be an isolation trench comprising an insulating material. As a further example, capacitor trenches may isolate single active area segments. As an alternative, isolation field effect transistors may act so as to separate active area segments. The isolation field effect transistor may be operated in an off-state so as to insulate neighboring active area segments which are assigned to one active area line, from each other. As is clearly to be understood, the isolation structures or the isolation field effect transistors may as well be formed during the following processing steps. Nevertheless, since the specific implementation of the isolation structure can be performed in any arbitrary manner, the following specification will be focused on the formation of the transistors of the first and second types, respectively.

For example, the active areas may be defined by defining isolation trenches, using an arbitrary hard mask layer or hard mask layer stack for patterning the substrate material. According to an embodiment, the pitch and, hence, the width of the active areas 515 may be defined so as to have a sub-lithographic value. By way of example, this may be accomplished by so-called doubled patterning methods. As a result, the width of the active areas 515 may be smaller than the smallest site which may be patterned by the lithographic method used.

Moreover, the active areas may be formed so as to extend in continuous lines 933, and, thereafter, they may be segmented by performing an additional photolithographic step. As an alternative, the active areas may be photolithographically segmented using a mask having a shape of extended dots or strip segments so as to define single segments, for example single segments of lines. As is illustrated in FIG. 5A, the active area lines may be arranged so as to be parallel to a first direction 11 which may be the direction of the bitlines to be formed later. Alternatively, the active area lives 110 may extend in a direction which is slanted with respect to the first direction. (FIG. 5B) The active area lives 110 may be straight or angled lines.

Figure 8:
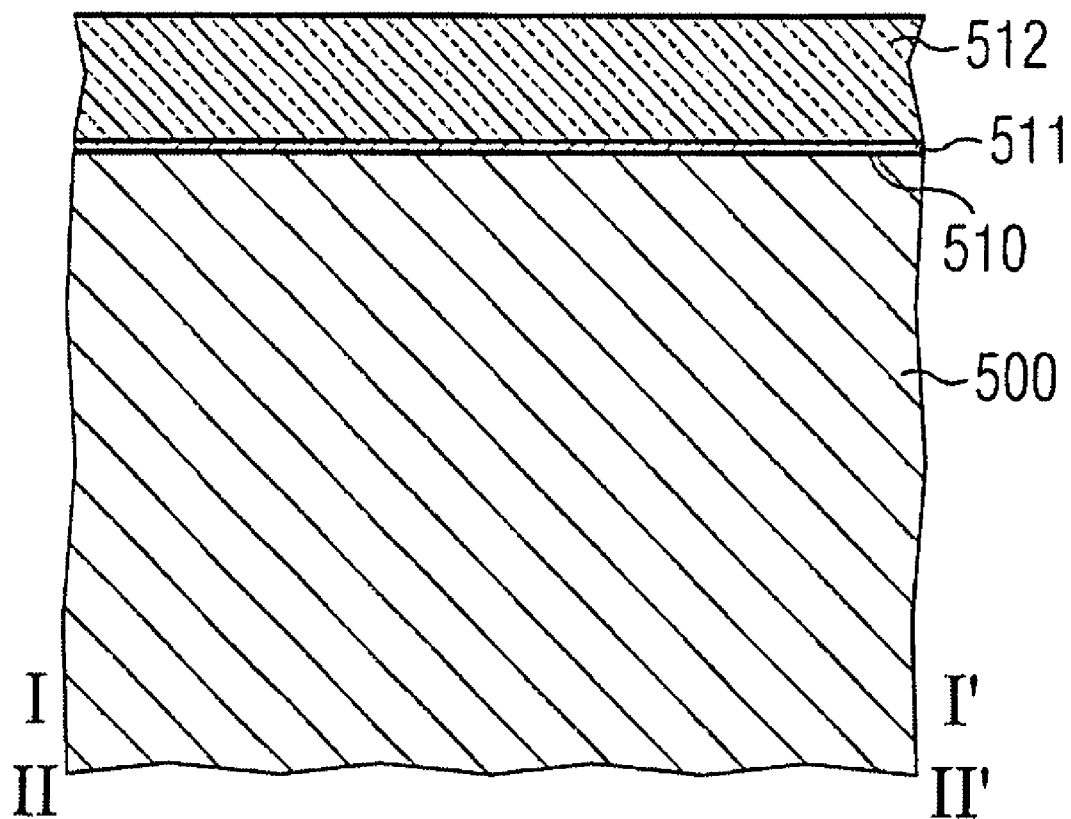

FIG. 8 shows an exemplary cross-sectional view of a work piece when performing the method according to an embodiment. The cross-sectional view which is shown in FIG. 8 may be taken between I and I or between II and II as cam be seen, for example, from FIGS. 9A and 9B. On the surface 510 of a semiconductor substrate 500, optionally, a thin silicon oxide layer 511 may be disposed, followed by a silicon nitride layer 512. The silicon oxide layer 511 may have a thickness of approximately 0.5 to 10 nm where as the silicon nitride layer 512 may have a thickness of approximately 50 to 100 nm. Thereafter, as is generally known in the art, active areas 515 may be defined in the support portion as well as the array portion by defining isolation trenches 513. By way of example, the isolation trenches 513 may be photolithographically defined using commonly known methods. For example, the isolation trenches 513 may be defined by etching the trenches 513 in the semiconductor substrate 500 and subsequently filling the trenches with an appropriate insulating material 514 such as silicon oxide, silicon nitride and others. For example, the insulating material 511 may comprise various insulating materials having a different composition. Moreover, different layers of the insulating material 514 may be deposited by different methods. For example, a first layer of the insulating material may be deposited by a spin-on method, followed by a HDP (high density plasma) deposition method. Thereafter, planarization steps such as a CMP (chemical mechanical polishing) step may be performed so as to obtain a smooth surface.

Figure 9B:
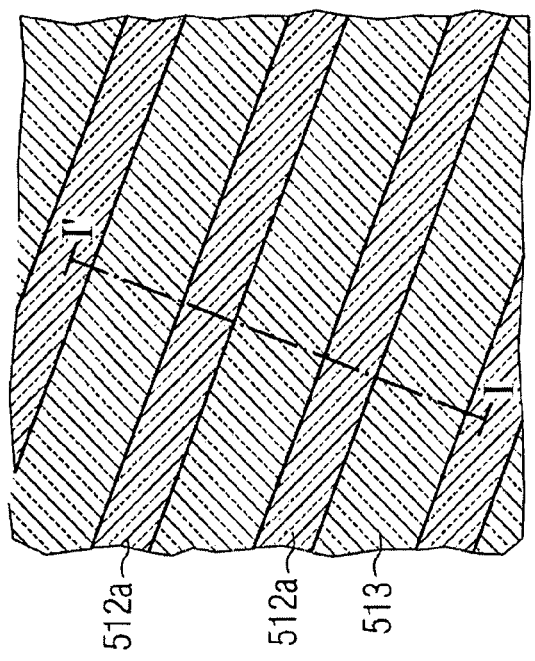
Figure 9A:
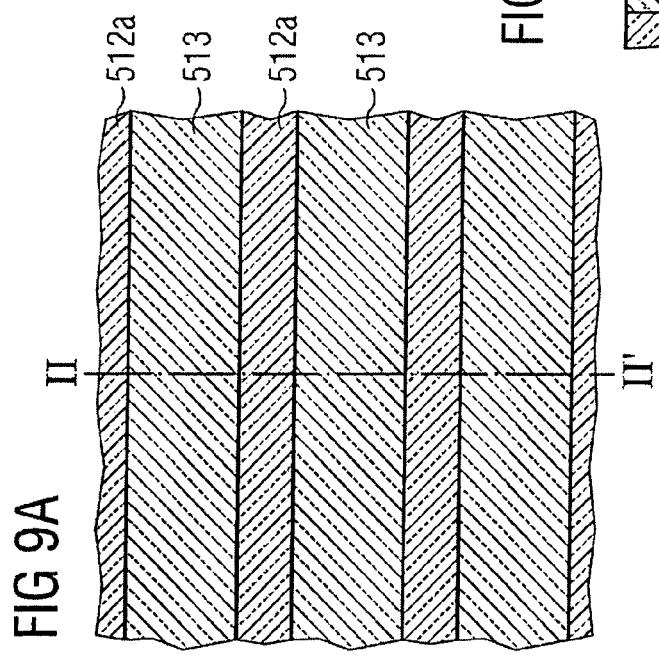
Figure 9C:
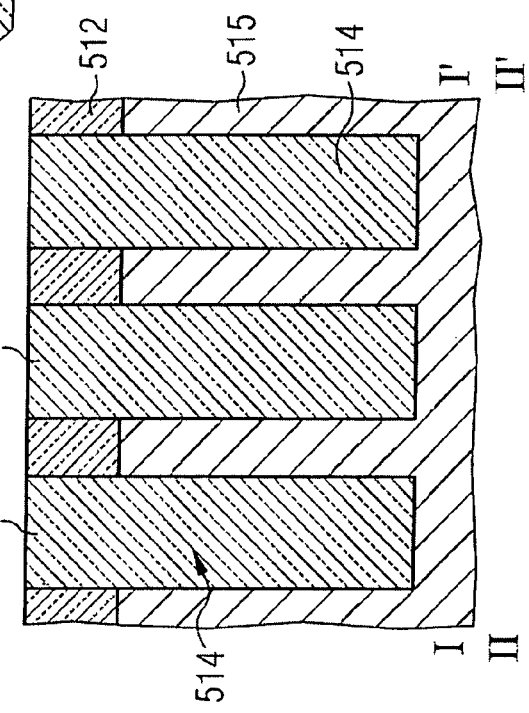

FIG. 9A shows an exemplary plan view of the support portion of an integrated circuit comprising silicon nitride lines 512a as well as isolation trenches 513. Moreover, FIG. 9B shows an exemplary plan view of an array portion comprising silicon nitride lines 512a and isolation trenches 513. For example, the direction of the isolation trenches 513 in the array portion may be slanted wish respect to the direction of the isolation trenches 513 in the support portion. Nevertheless, as is clearly to be understood, any arbitrary directional relationship may be implemented between the isolation trenches 513 in the array portion and the isolation trenches 513 in the support portion. Moreover, FIG. 9C shows a cross-sectional view of the semiconductor substrate 500 which may be taken in the array portion between I and I as well as in the support portion between II and II. The cross-sectional view of FIG. 9C is taken perpendicularly with respect to the direction of the isolation trenches 513 and active areas 515, respectively.

Figure 10:
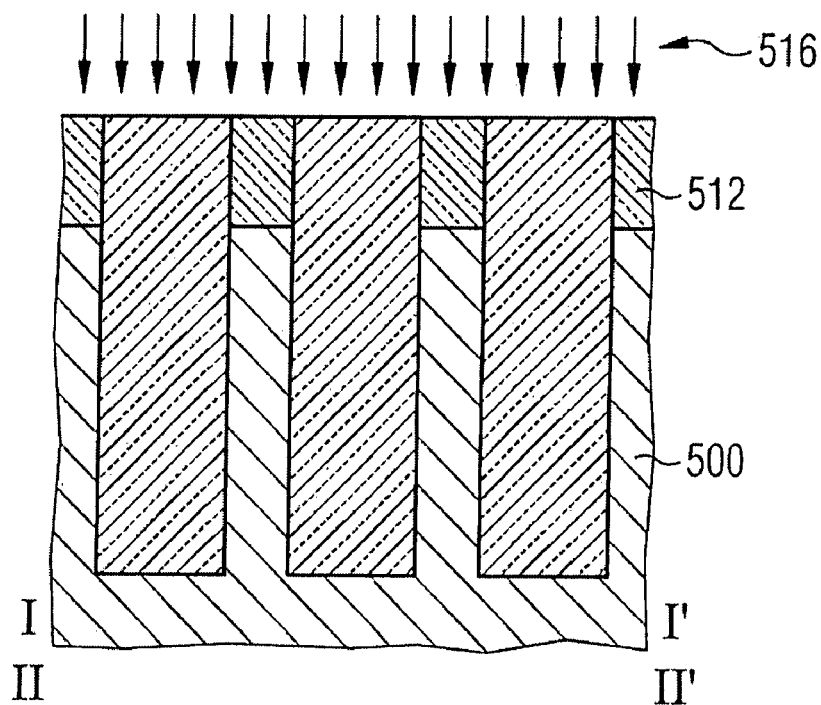

Thereafter, optionally, an ion implantation step may be performed so as to provide an anti-punch implant. Due to this implantation step, doped portions are provided in the substrate so as to avoid a punch-through between adjacent source/drain portions. FIG. 10 shows a cross-sectional view of the substrate 500 when performing the ion implantation 516. As can be seen, the whole substrate surface is implanted with ions.

Figure 11:
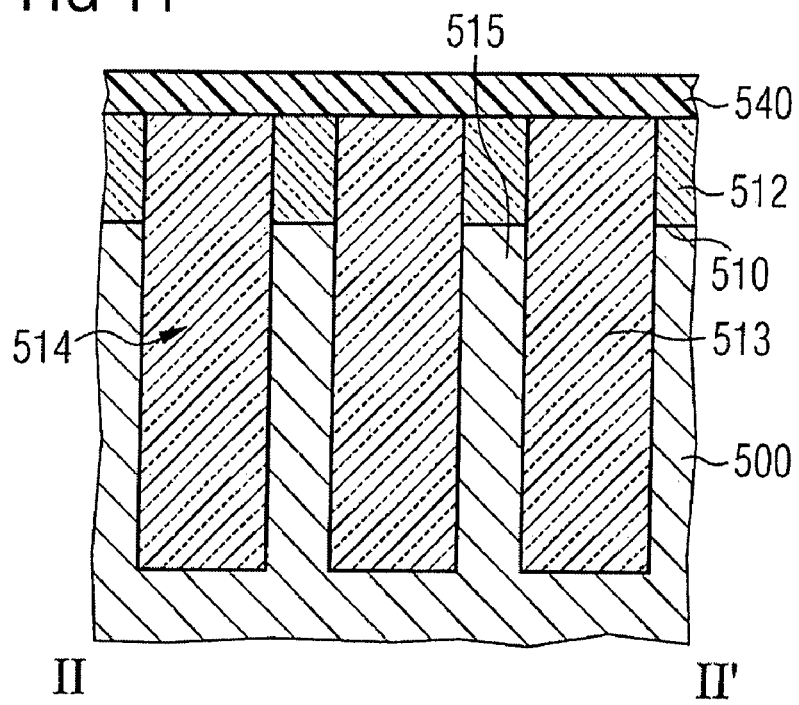

Thereafter, an appropriate resist material 540 is deposited over the support portion so as to protect the support portion when performing the next processing steps. For example, any kind of suitable resist layer or hard mask layer 540 comprising a stack including several different layers may be used. The resist layer 540 is selected from appropriate materials so as to make sure that the support portion will not be affected by the neat processing steps. Examples of the resist layer 540 comprise a carbon hardmask layer, a photoresist layer, a high resolution photoresist layer or a combination thereof. A cross-sectional view of an exemplary substrate between II and II in the support portion is shown in FIG. 11.

Thereafter, the pad nitride layer 512 may be removed from the array portion. Then, a sacrificial silicon oxide layer 541 may be formed above the array portion. Various implantation steps may be performed so as to provide doped portions where appropriate. Moreover, the doped well portions may be defined. Thereafter, the sacrificial oxide layer may be removed, followed by a step of forming a silicon oxide layer 541 which is in contact with the substrate surface 510. In the next processing steps, the silicon oxide layer 541 will act as a barrier layer to insulate the substrate from the bit lines to be formed. Thereafter, a mask layer 542 which may be made of undoped polysilicon is deposited, which may be followed by a silicon nitride layer 543. By way of example, the silicon oxide layer 541 may have a thickness of approximately of 2 to 5 nm, the polysilicon layer 542 may have a thickness of 20 to 80 nm, for example, 40 to 60 nm, and the silicon nitride layer 543 may have a thickness of 30 to 60 nm. Cross-sectional views of an exemplary substrate are shown in FIGS. 12A and 12B, respectively. As can be seen from FIG. 12A, in the support portion between II and II, the layers 541, 542 and 543 are formed over the resist material 540. In the array portion between III and III, these layers are formed directly above the semiconductor substrate surface 510.

For defining the gate grooves in the array portion, a suitable hard mask may be deposited. For example, a carbon hard mask which is generally known may be used. Thereafter, a photolithographic step is performed so as to correspondingly pattern the hard mask (not shown). For example, a mask having a line/spaces pattern may be used for defining the gate grooves. After patterning the carbon hard mask layer, an etching step may be performed so as to correspondingly pattern the silicon nitride layer 543 as well as the polysilicon layer 542. This etching step may be performed so as to stop on the surface of the silicon oxide layer 541.

Figure 13B:
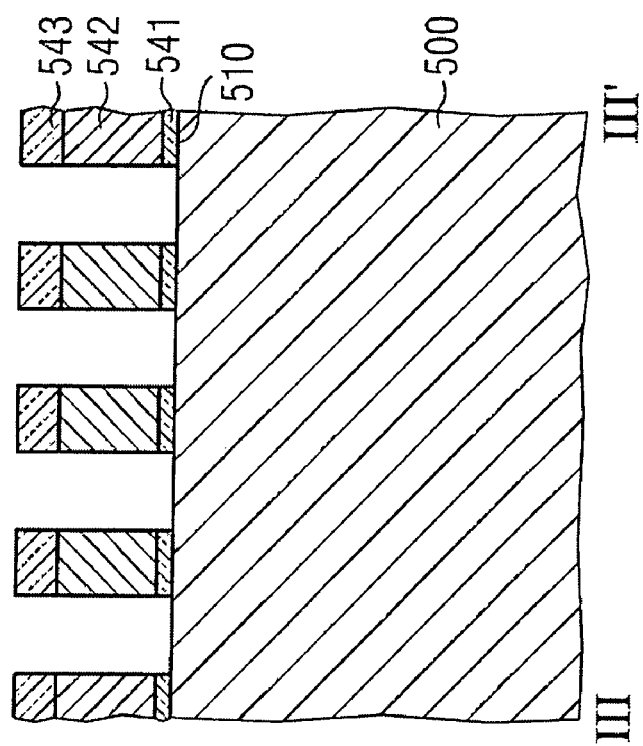
Figure 13A:
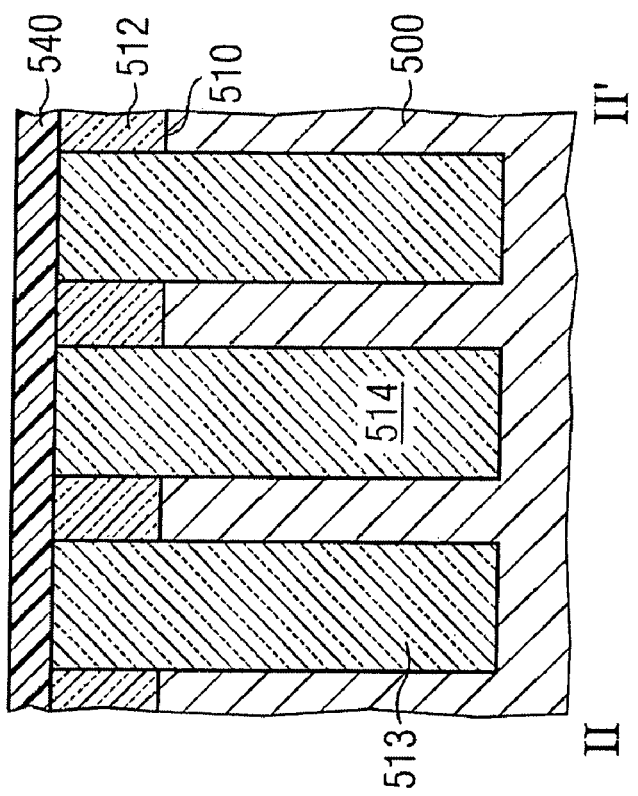
Figure 14:
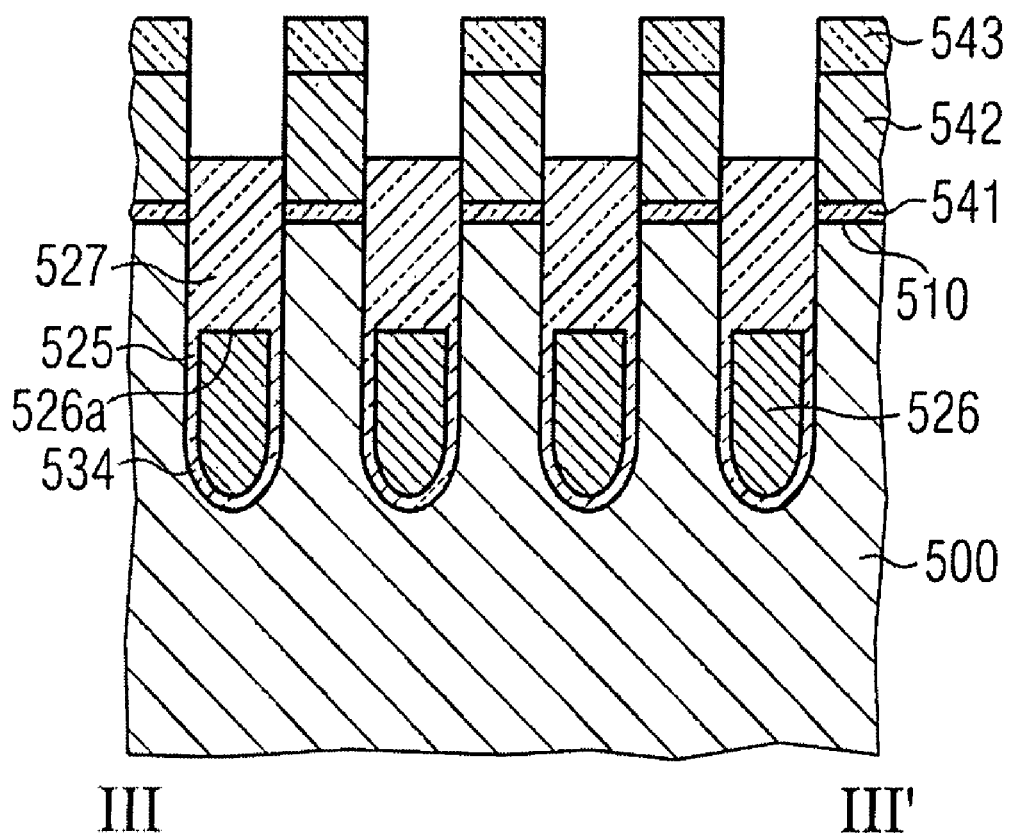

FIGS. 13A and 13B show exemplary cross-sectional sieves of the substrate after these processing steps. As can be seen from FIG. 13A, in the support portion between II and II, the polysilicon layer 542 and the silicon nitride layer 543 are completely removed. Moreover, in the array portion between III and III, lines comprising the polysilicon/silicon nitride layer stack are formed, while maintaining the silicon oxide layer 541. In the next step, the silicon oxide layer 541 may be etched, followed by a step of etching the silicon substrate material 500. During this etching step the lines of the silicon, nitride layer 543 are taken as a hard mask. For example, this etching, may be performed as an isotropic etching, for example, by reactive ion etching. Optionally, thereafter, an oxide etching step may be performed so as to define vertical portions of the transistor in the array portion. By this optional etching step, the insulating material in the isolation trenches is etched in the plane which lies before and behind the illustrated drawing plane. Then, a step for providing a gate insulating material 525 is performed, followed by a step of filling a conductive material 526 in the gate grooves 534. Examples of the conductive material comprise polysilicon, metals such as tungsten or metal compounds and combinations thereof. The conductive material may be recessed so that an upper surface of the conductive material 526 is disposed beneath the substrate surface 510. Thereafter, an insulating material such as silicon oxide 527 may be filled in the upper portion of the gate grooves 534. For example, this many be accomplished by a HDP method. The insulating material may be recessed or planarized. Thereafter, a recessing step may be performed so that an upper surface of the insulating material 527 is disposed beneath the surface of the hard mask layers 543 and above the surface 510 of the semiconductor substrate 500. A cross-sectional view of an exemplary integrated circuit is shown in FIG. 14. As can be seen, the surface of the conductive material 526 is disposed beneath the substrate surface 510.

Figure 15A:
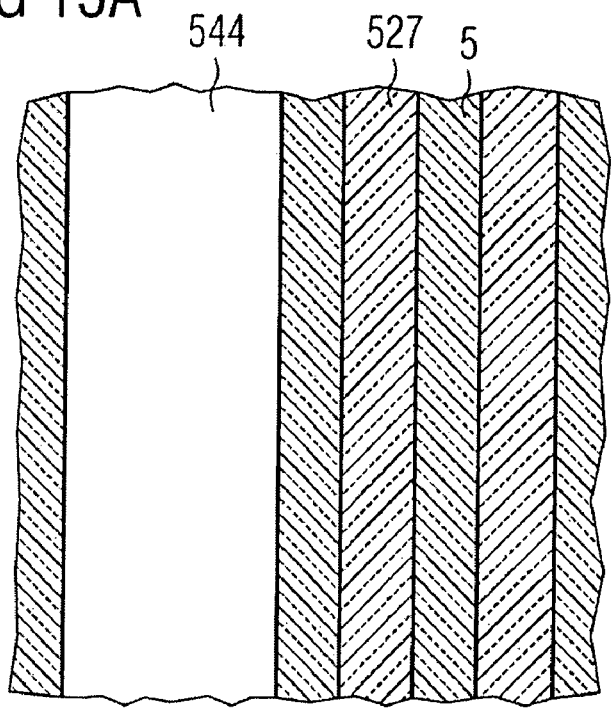
Figure 15B:
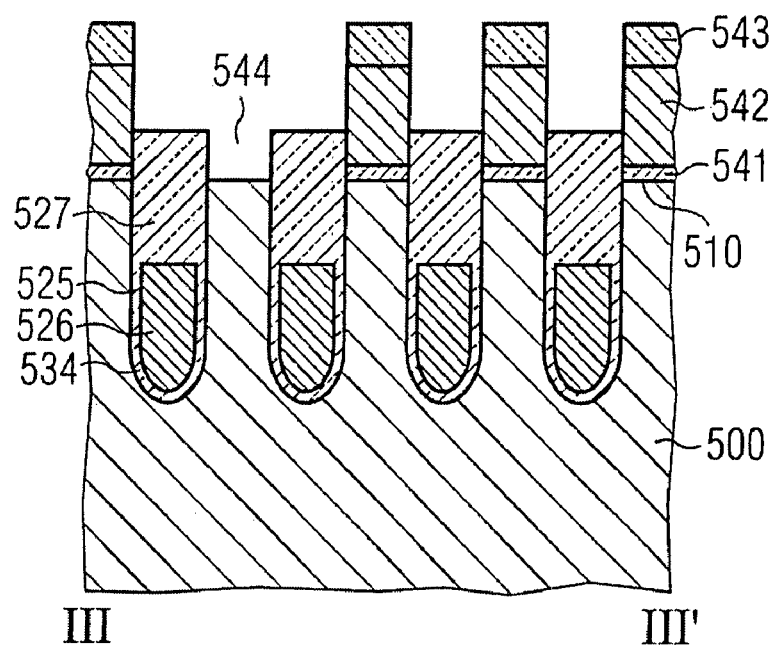

Thereafter, a photolithographic method is performed so as to define bit line contact openings in the insulating layer 541. For example, a photolithographic step using a mask having a line/spaces pattern may be employed to define the positions from which the silicon oxide layer 541 is to be removed. For example, a line width of the mask may be approximately 4*F whereas the spaces width is approximately 2*F. Accordingly, lines having a width of 2*F are opened at the positions at which the insulating layer 541 is to be removed. FIG. 15A shows a plan view of the array portion after performing the etching step. As can be seen, an opening 544 having a width of approximately 2*F is formed. Moreover, FIG. 15B shows an exemplary cross-sectional view after performing the etching step. As can be seen, a predetermined portion of the semiconductor substrate 510 now is uncovered. In particular, the silicon nitride layer 543, the polysilicon layer 542 as well as a barrier oxide layer 541 have been etched. Thereafter, the photoresist material may be stripped from the substrate.

Figure 16A:
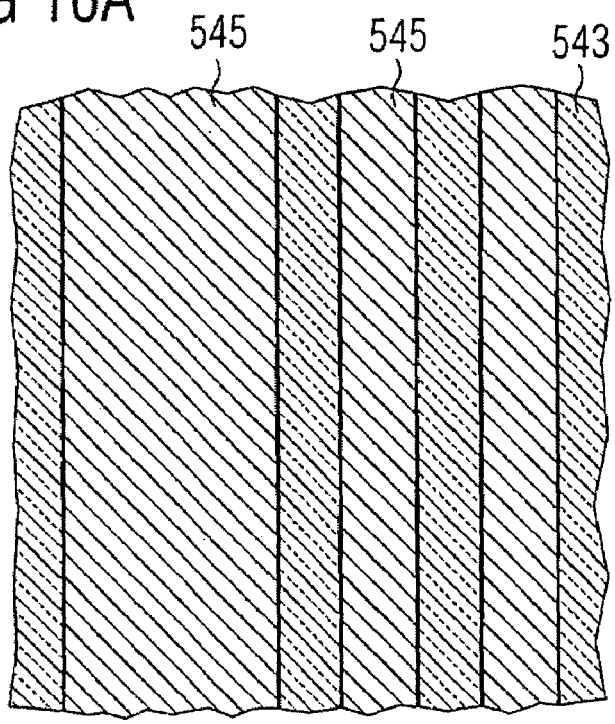
Figure 16B:
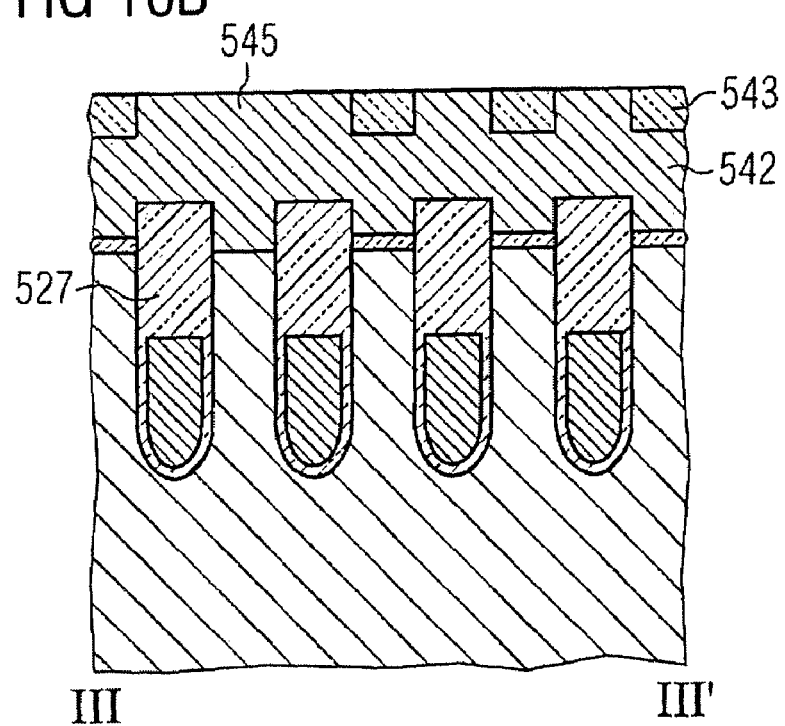

Thereafter, a cleaning step may be performed, for example, using dilated HF (hydrofluouric acid). Then, a conductive material such as a polysilicon layer may be deposited. For example, after depositing the conductive layer, a CMP step may be performed which stops on silicon nitride. FIGS. 16A and 16B show exemplary views of an exemplary substrate after this processing step. As can be seen from FIG. 16A showing a plan view of the array portion, now, polysilicon lines 545 are formed, the polysilicon lines 545 being isolated by silicon nitride lines 543. Moreover, as can be seen from the cross-sectional view in FIG. 16B, the polysilicon material 545 fills the bit line contact opening 544.

Thereafter, the silicon nitride material may be removed, for example, by etching, followed by a planarizing step, for example, a CMP step. A cross-sectional view of an exemplary substrate is shown in FIG. 17. As can be seen, now, a polysilicon layer 542 is disposed above the silicon substrate 500. In the silicon substrate 500, buried conductive lines 526 are disposed. At predetermined positions, the polysilicon layer 542 is in contact with the silicon substrate 500.

Figure 18A:
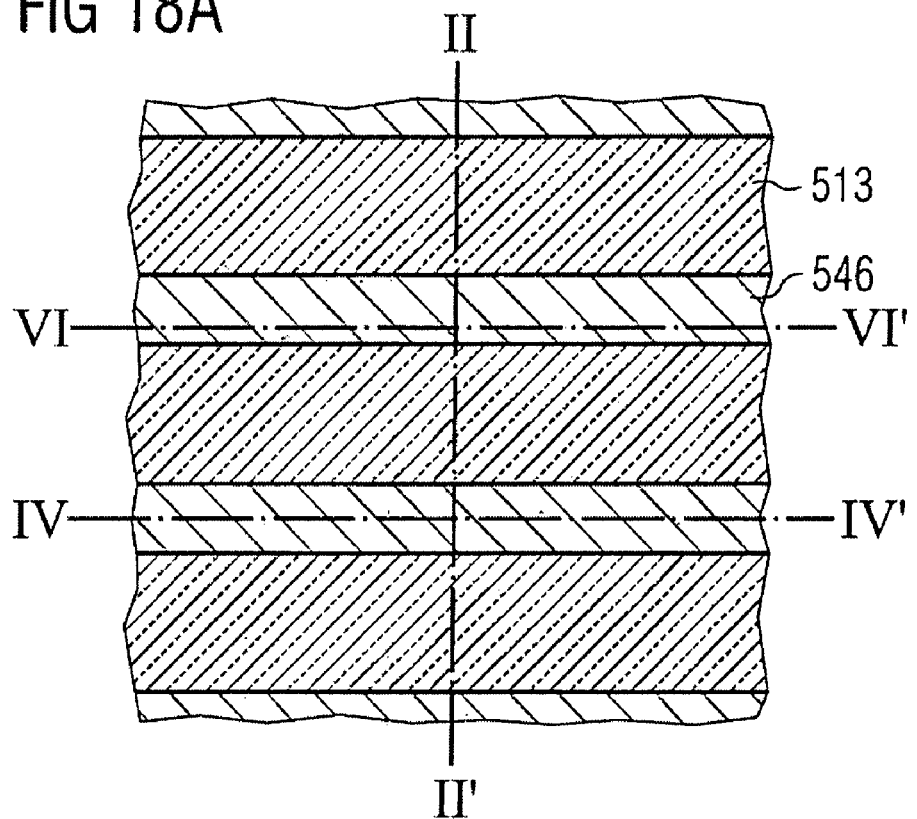
Figure 18B:
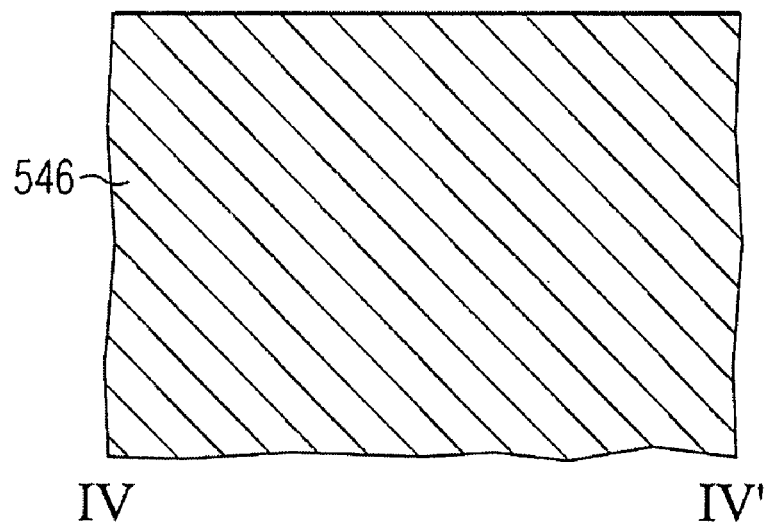
Figure 18D:
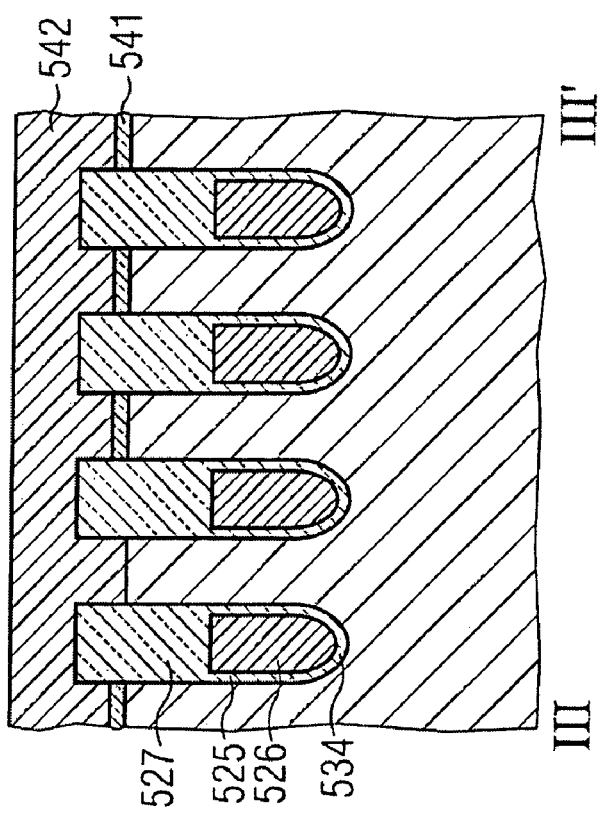
Figure 18C:
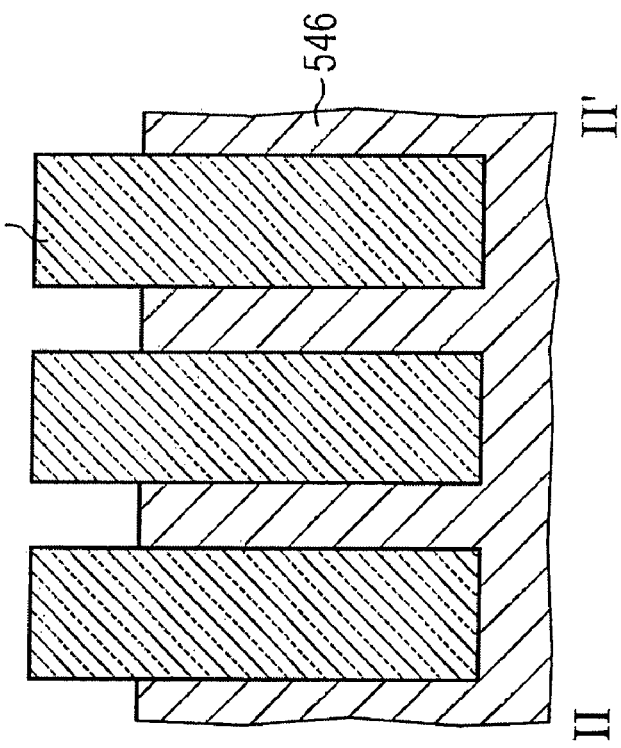

After correspondingly processing the buried conductive lines in the array portion, the support portion will be further processed. Accordingly, the resist layer 540 is removed from the support portion, followed by a step of removing the silicon nitride layer 512 from the support portion. FIGS. 18A to 18B show various exemplary views of the substrate after performing this processing step. As can be seen from FIG. 18A showing a plan view of the support portion, substrate portions 545 are uncovered between the isolation trenches 513. FIG. 18B illustrates a cross-sectional view between IV an IV extending between adjacent isolation trenches 513. FIG. 18C illustrates a cross-sectional view which is taken so as to intersect various isolation trenches 513. The array portion which is illustrated in FIG. 18D remains unaffected by the resist layer strip.

In the following, a method of forming a transistor of the first type in the support portion will be described as an example. Nevertheless as is clearly to be understood, the transistor of the first type may be formed by any other suitable method. In the following description, the vertical portions of the transistors are formed by means of a spacer process. Accordingly, over a substrate comprising protruding portions, for example, of a non-substrate material, a thin conformal sacrificial layer is formed to cover substrate portions adjacent to the protruding portions. In a later processing step, the sacrificial material is removed followed by an etching step of etching the substrate material. Thereby, the vertical portions of the transistors are etched in a self-aligned manner with respect to the protruding portions.

According to another embodiment, the vertical portions may be defined photolithographically. For example, a suitable hardmask or resist material is formed over a substrate having a planar surface without protruding portions. Then, a lithographic process is performed to open portions of the isolation trenches where the vertical portions are to be formed. By performing an etching step to selectively etch the insulating material of the isolation trenches, the vertical portions of the gate electrode may be formed.

Figure 19B:
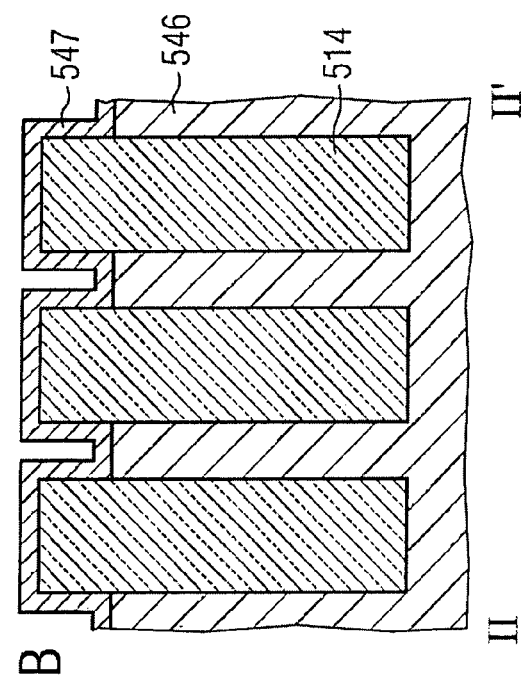
Figure 19A:
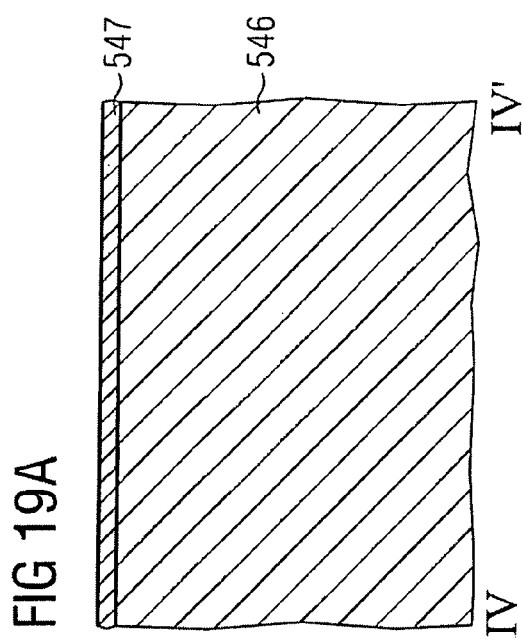
Figure 19C:
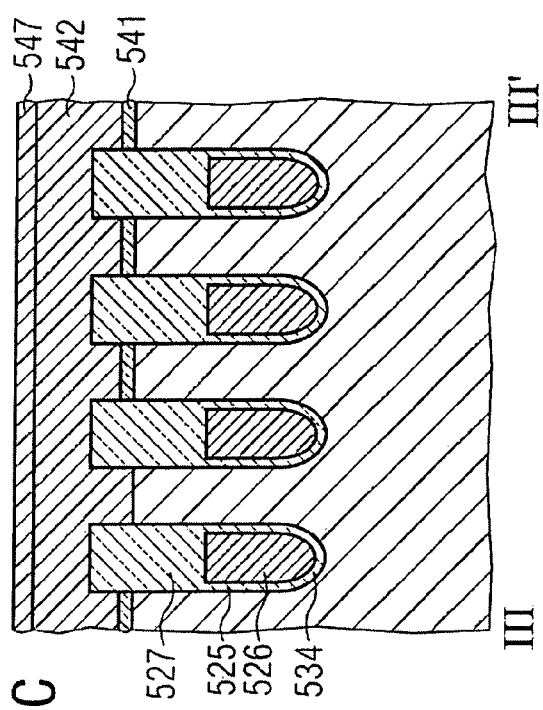

As is shown in FIG. 19, first a sacrificial liner 547 may be deposited in the array portion as well as in the support portion. Examples of the material of the sacrificial liner 547 comprise, for example, polysilicon or amorphous silicon which may be correspondingly doped. Further examples comprise nitridated polysilicon or nitridated amorphous silicon, and silicon nitride. To be more specific, any suitable layer may be used which may be etched selectively with respect to the material which is present in the isolation trenches 513. The sacrificial liner 547 is deposited so as to form vertical portions and horizontal portions as can be seen from FIG. 19B, for example. As can be seen from the cross-sectional view shown in FIG. 19A, between adjacent isolation trenches 513 the sacrificial liner 547 is formed as a planar layer. Moreover, in the array portion between III and III, the sacrificial liner 547 is formed as a planar layer.

Figure 20A:
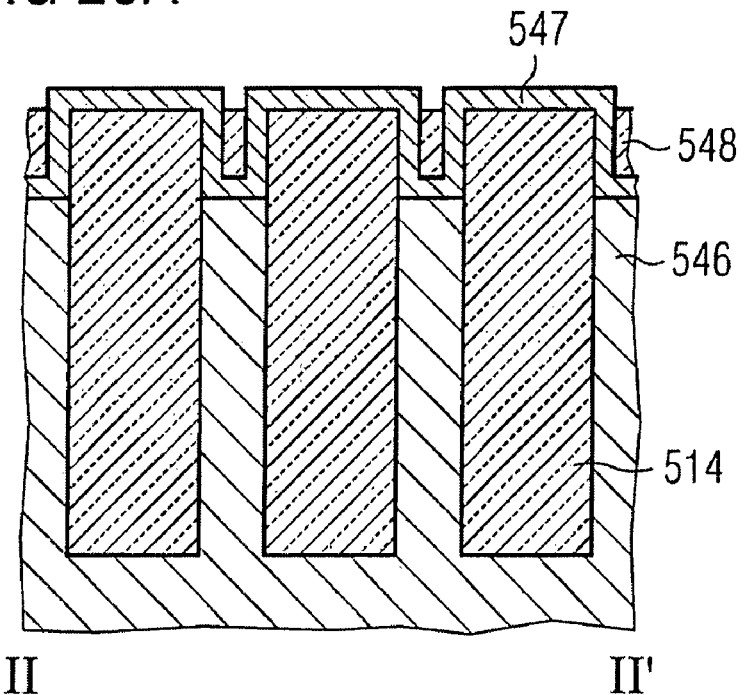
Figure 20B:
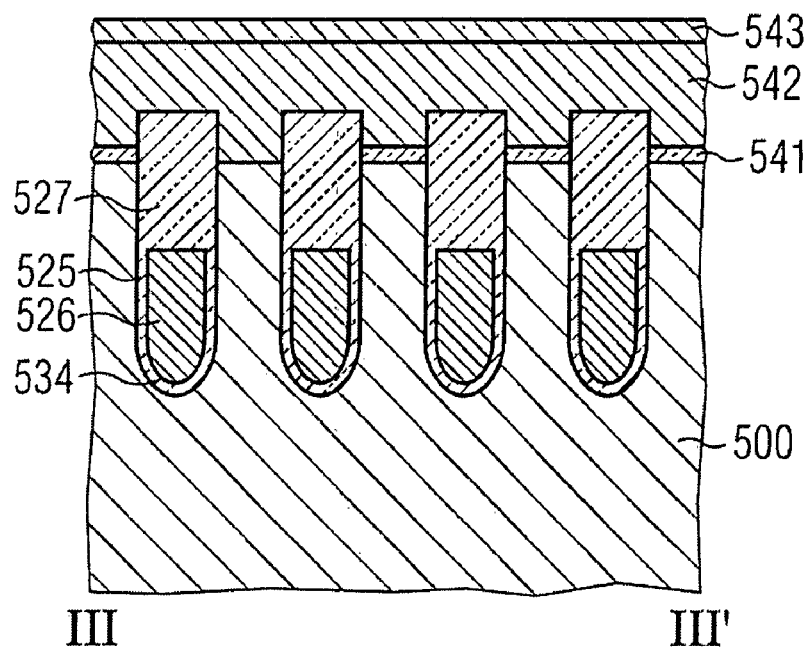

Thereafter, an oxide layer may be deposited and recessed. As a consequence, as can be seen from FIG. 20A, the spaces between adjacent vertical portions of the sacrificial liner 597 may be filled with the silicon oxide material 548. Moreover, due to the recessing step, the array portion between III and III is unaffected (FIG. 20B).

Figure 21A:
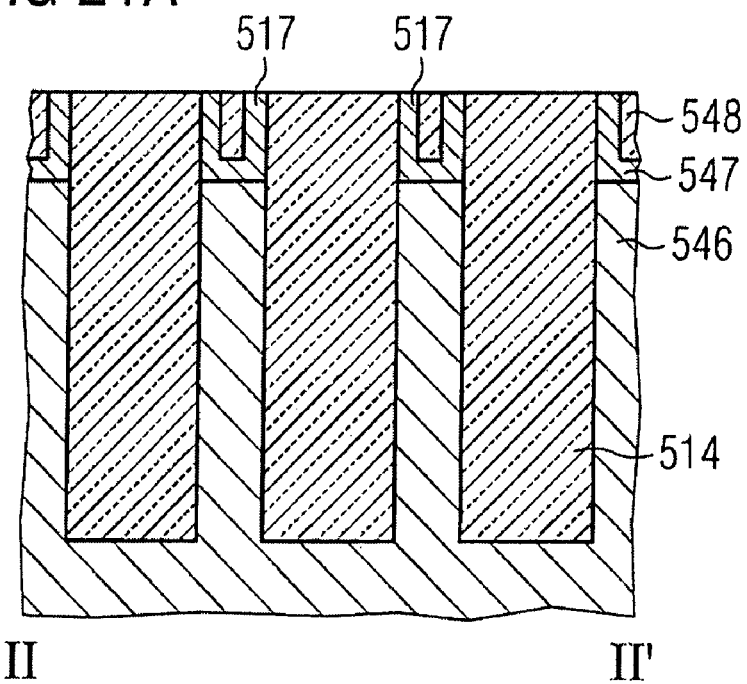
Figure 21B:
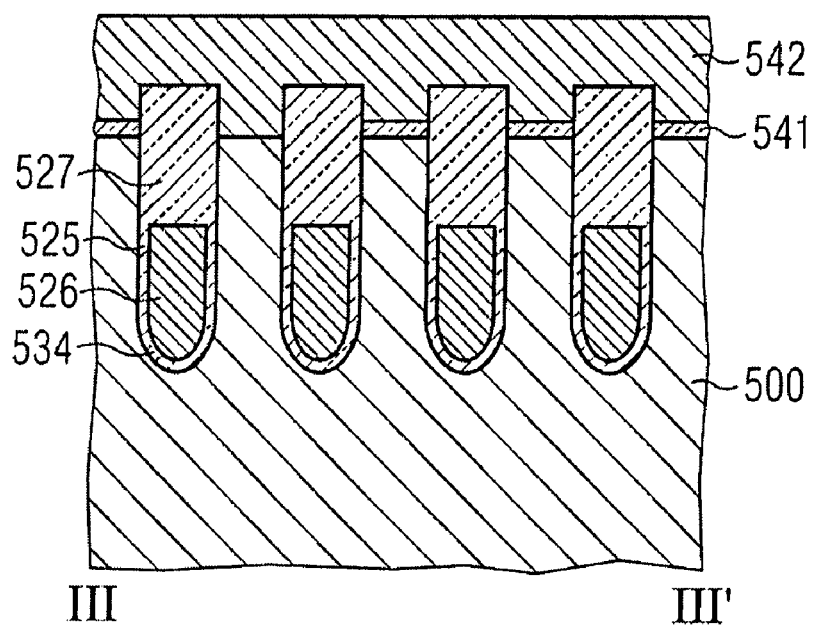

Thereafter, an etching step for etching the sacrificial liner 547 is performed so to remove the horizontal portions of the sacrificial liner 547. Accordingly, as can be seen from FIG. 21A, the surface of the isolation trenches 513 now is uncovered. Moreover, the sacrificial liner 547 is removed from the array portion. In the support portion between II and II sacrificial spacers 517 are remaining.

Figure 22A:
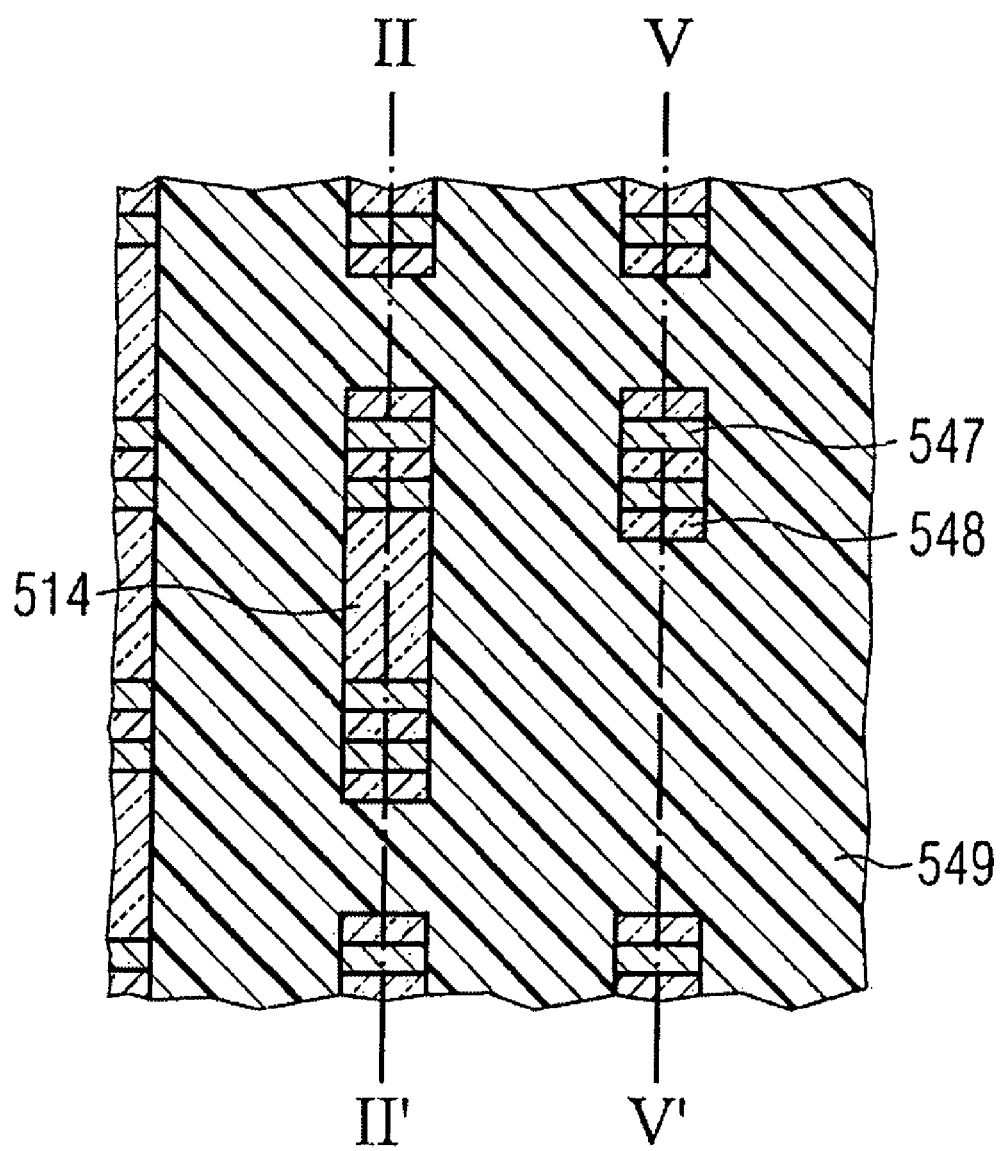
Figure 22B:
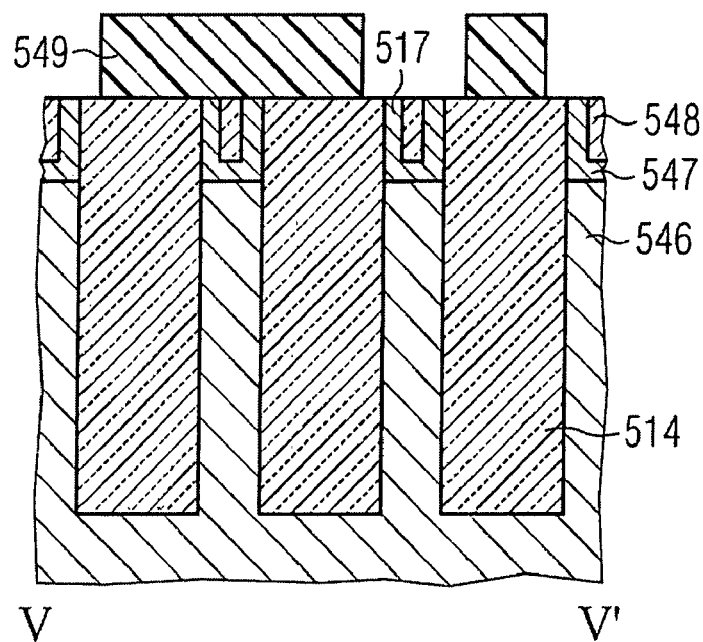
Figure 22C:
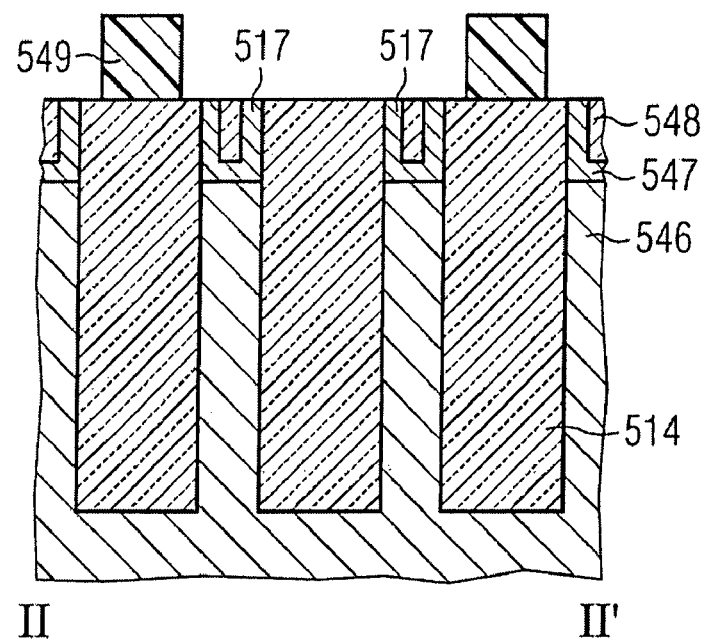

Thereafter, lithographic steps are performed. Accordingly, the whole substrate will be covered by suitable hard mask layers and photoresist materials. For example, the array portion may be completely covered with the hard mask layers and the photoresist material. The hard mask layers and the photoresist material may comprise any of the layers which are commonly used. The photoresist material is correspondingly exposed and developed and the hard mask layer(s) are correspondingly patterned. In the next Figures only one layer 549 for representing the photoresist material is shown. Nevertheless, as is clearly to be understood, the illustrated, layer 549 comprises the photoresist material as well as any of the hard mask layer(s) employed. In the next steps, the photoresist material is patterned so as to be opened at those positions at which the transistors of the first type are to be formed. FIGS. 22A to 22C show various views of an exemplary substrate portion. As can be seen from FIG. 22A showing a plan view, selected portions of the substrate surface are exposed. To be more specific, as can be seen from FIGS. 22B and 22C, the photoresist layer 547 is opened at those positions at which the transistors of the first type are to be formed.

Figure 23A:
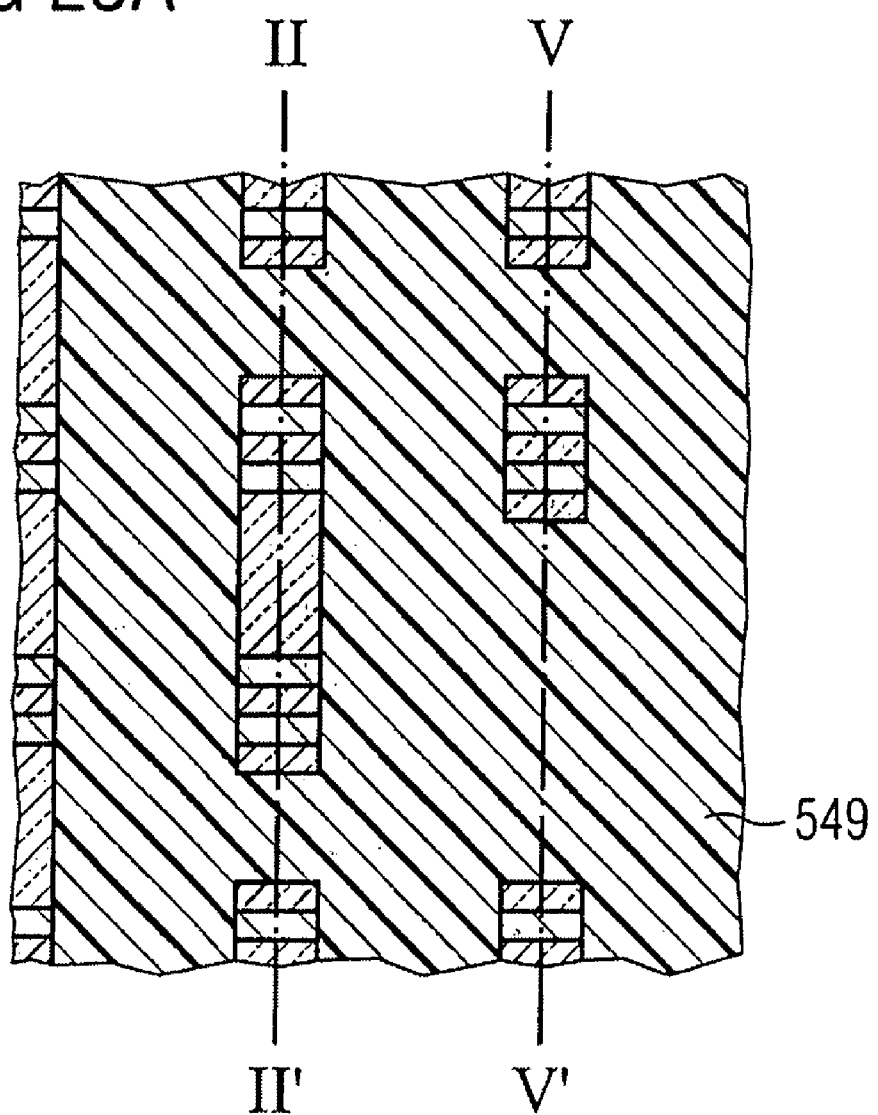
Figure 23B:
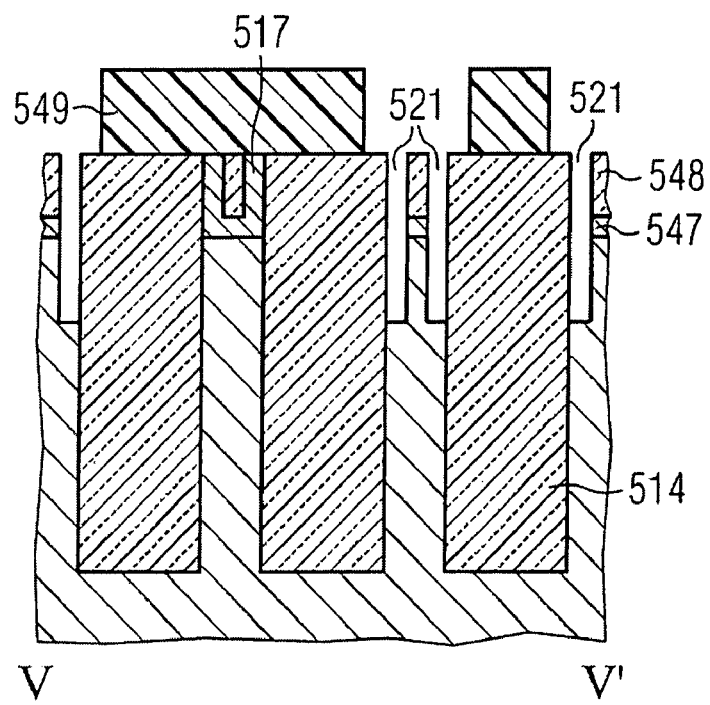
Figure 23C:
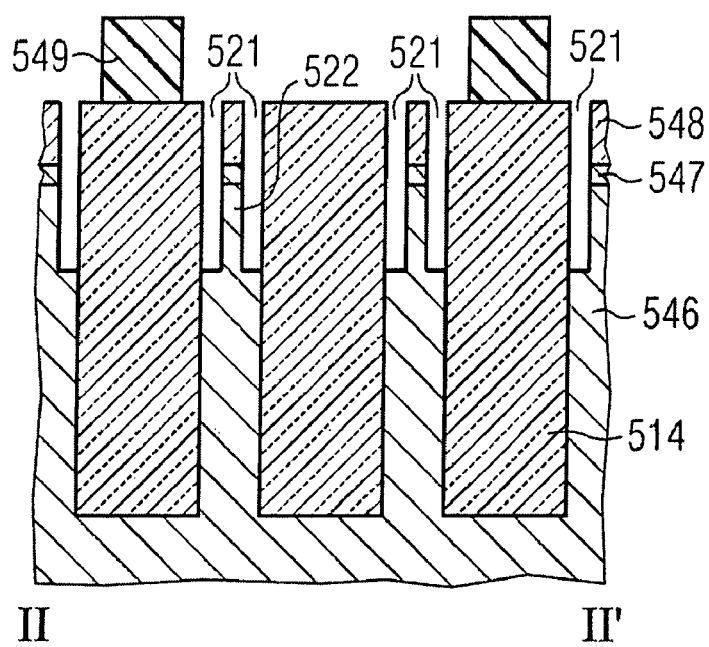
Figure 24A:
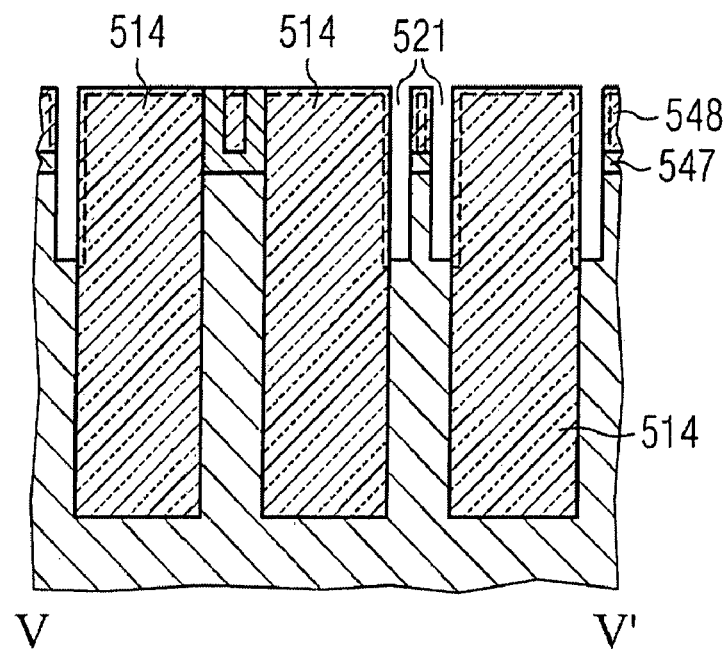
Figure 24B:
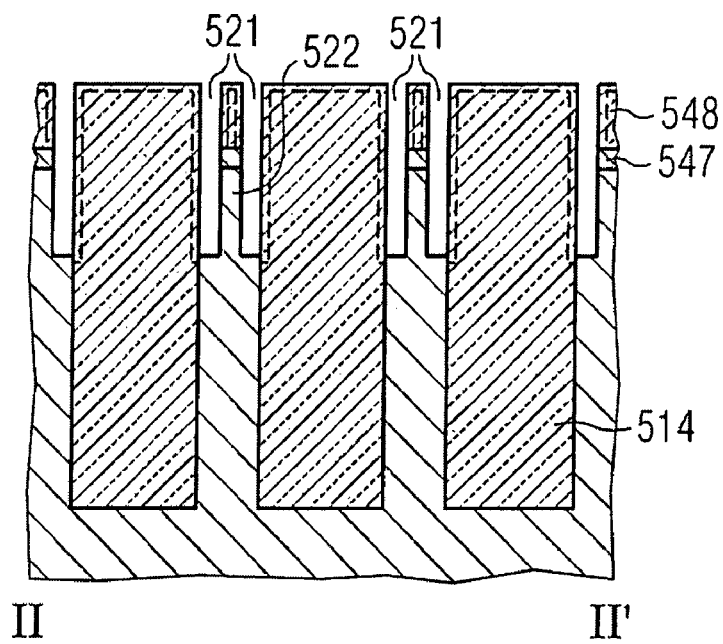

Thereafter, first, the sacrificial spacer 517 will be etched, followed by a step of etching silicon substrate material 500. For example, if polysilicon is taken as the material of the sacrificial spacer, the same etching method can be employed for etching the sacrificial spacer 517 as well as the substrate material 500. FIG. 23A to 23C show various views of an exemplary substrate after performing this etching step. As can been seen from FIG. 23A showing a plan view of the substrate, the sacrificial spacer is removed from predetermined positions. Moreover, as can be seen from FIG. 23B showing a cross-sectional view between V and V, pockets are formed in the substrate material 500, leaving a fin-like portion 522 between adjacent pockets 521. Accordingly, the thickness of the sacrificial spacer 517 determines the width of the pockets 521 and, hence, the width of the fin-lime portion 522. As can be seen from the cross-sectional view between V and V some of the sacrificial spacers 517 are still covered by the photoresist material 549. Thereafter, the photoresist material 549 as well the remaining portions of the hard mask layers may be removed from the substrate. Optionally, a further etching step may be performed so as to etch a portion of the isolation trenches. Thereby, the width of the vertical portions of the gate electrode to be formed may be increased. FIGS. 24A and 24B show exemplary cross-sectional views after these processing steps. The broken lines indicate the surface after the optional isolation trench etching step. Thereafter, optionally, the fin-like portion 522 of the substrate may be thinned by performing a suitable etching step, for example, an isotropic or etching step.

Figure 25A:
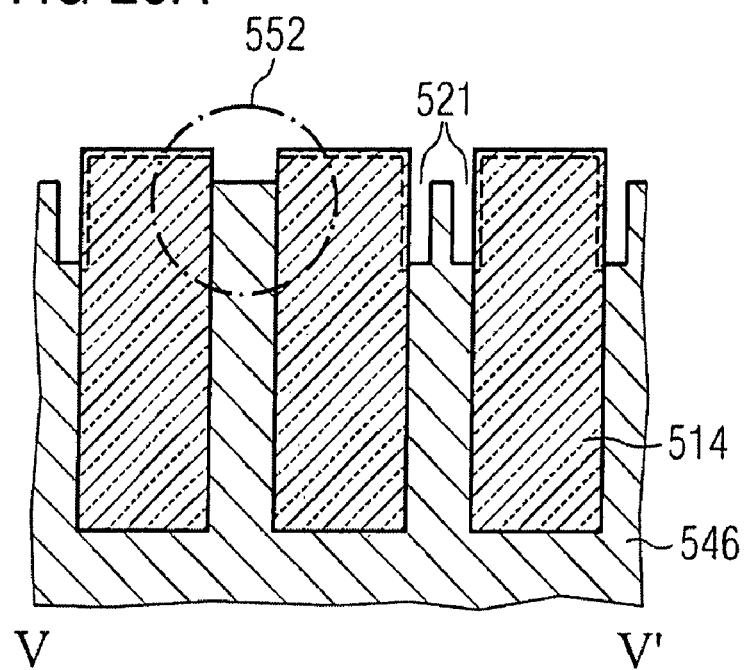
Figure 25B:
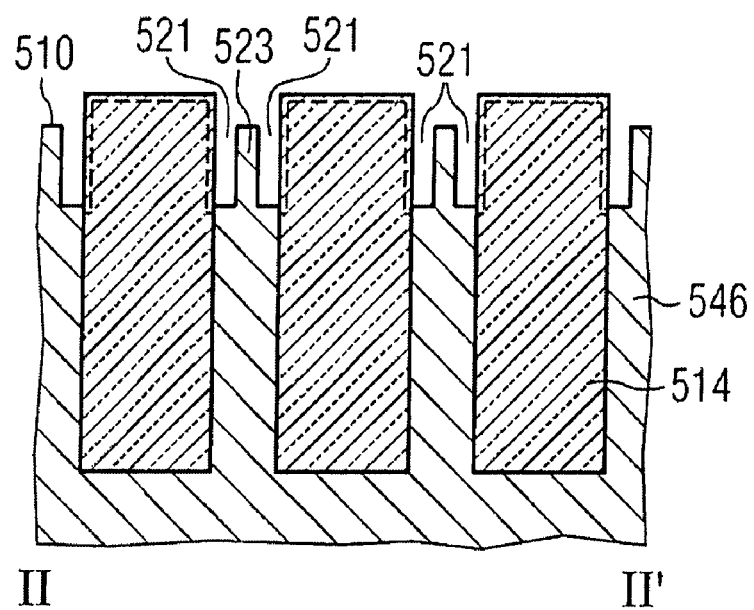
Figure 26:
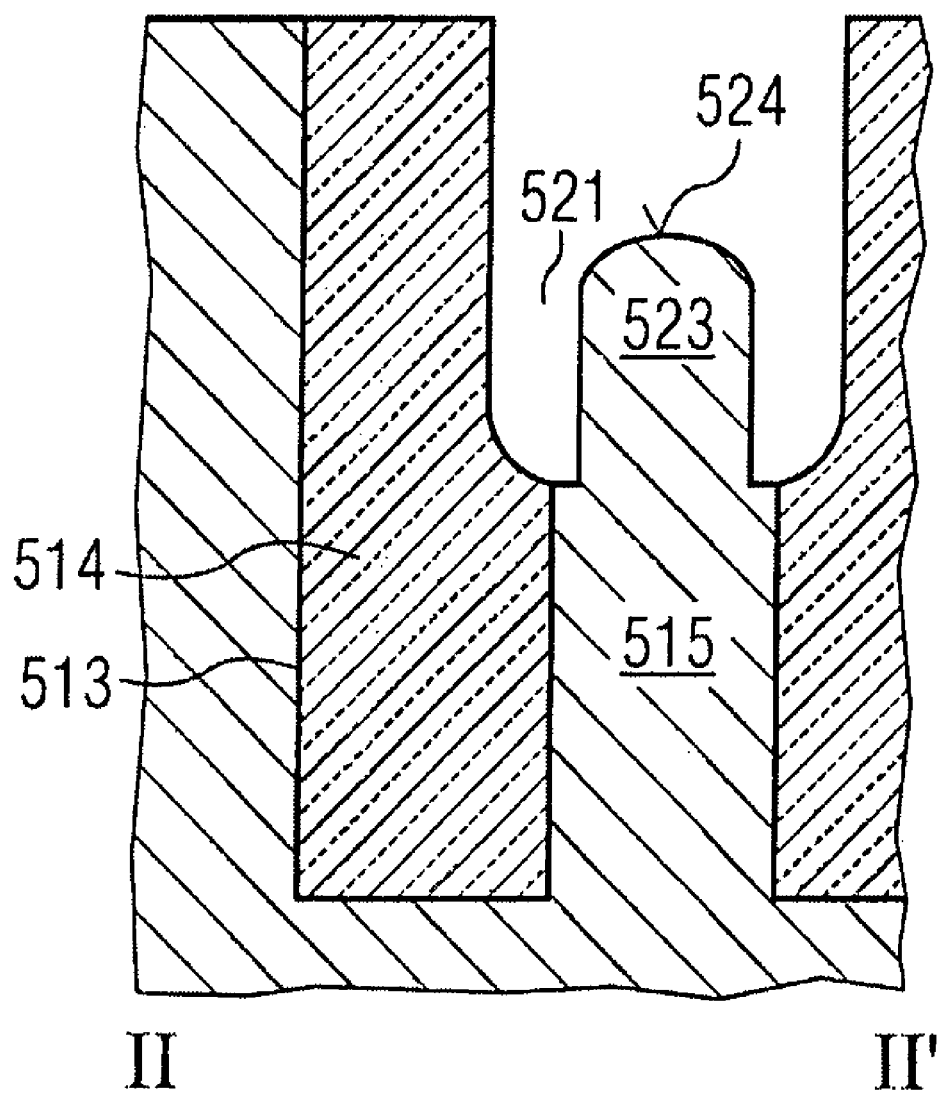

Thereafter, the remaining portions of the silicon oxide layer 548 may be removed, followed by a step of removing the remaining portions of the sacrificial liner layer 547. Optionally, thereafter the fin-like portion may be thinned so as to obtain a thinned fin-like portion 523. FIGS. 25A and 25B show exemplary cross-sectional views of a substrate after performing these processing steps. As can be seen from FIG. 25A, in the cross-sectional view between V and V, pockets 521 are formed in the semiconductor substrate 500 at predetermined positions. As can also be seen frees FIG. 25A at the substrate portion indicated by 552 a planar transistor is to be formed. Accordingly, no etching has been performed in this area 552. Moreover, as can be seen in the cross-sectional view between II and II shown in FIG. 25B, the pockets 521 are formed in the semiconductor substrate 500. For example, the pockets may have a width of 10 to 30 nm. Moreover, the pockets may extend to a depth of approximately 30 to 100 nm, for example, 70 nm when measured from the substrate surface 510. The width of the fin-like portions may be 10 to 100 nm for example, 15 to 25 nm. Optionally, additionally, an annealing step may be performed in hydrogen. For example, this annealing step may be performed at a temperature of approximately 800° C. for typically one minute. As a result, as is shown in FIG. 26, the upper edges of the fin-like portion 522 may be shaped so as to have a round or circular form. For example, as a result of minimizing the surface energy during this annealing step, the silicon material is rounded so as to obtain fin-like portions 522 having a rounded or a circular cress-section. An exemplary cross-sectional view after performing such an annealing step is shown in FIG. 26. Thereafter, a suitable gate dielectric material 525 may be deposited by generally known methods. Examples for a suitable gate dielectric comprise silicon oxide, silicon nitride, any kind of high-k dielectrics and combinations of these materials.

Figure 27A:
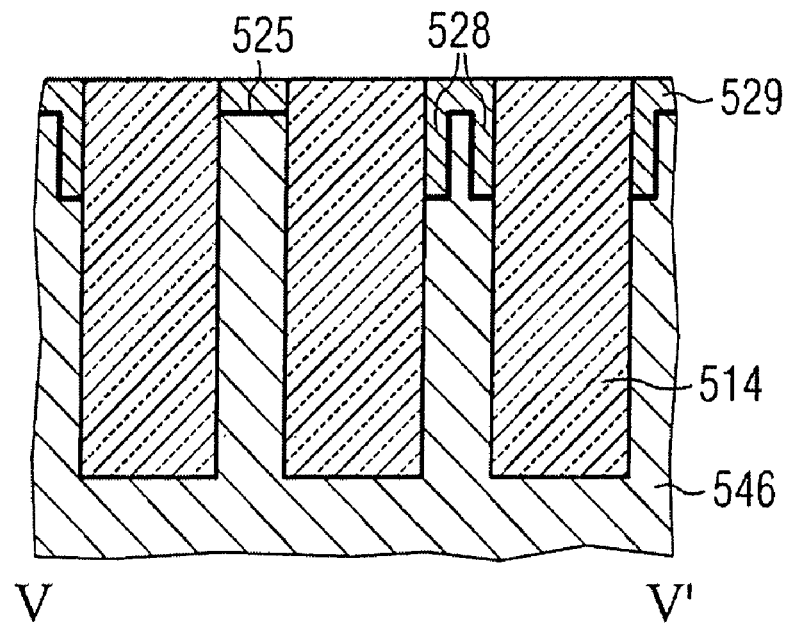
Figure 27B:
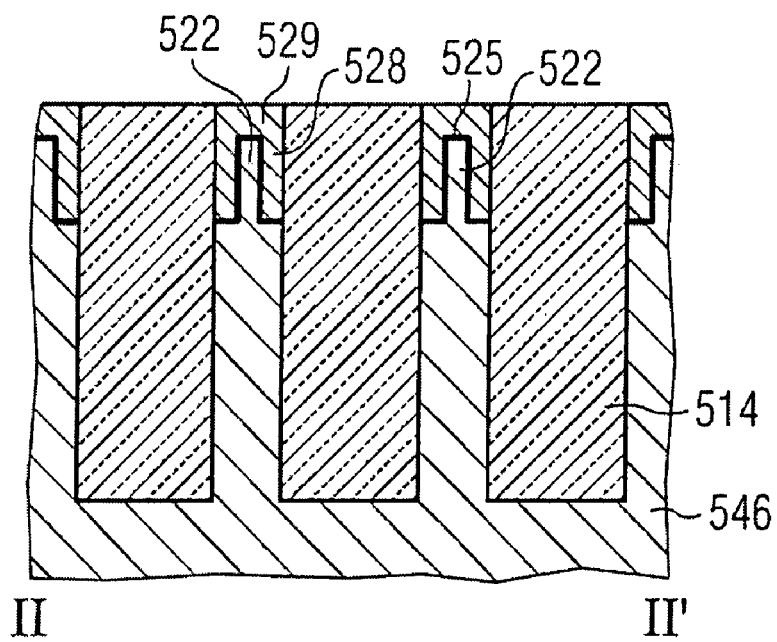

Then, a suitable conductive material 529 may be deposited, followed by a suitable recessing step so as to obtain a planarized surface. Examples for the conductive materials 529 of the gate electrode comprise, for example, polysilicon or any suitable metal. As is clearly to be understood, a layer stack comprising layers of different materials may be deposited. For example, the conductive material 529 may comprise a TiN liner, which may be used solely or in combination, for example, with polysilicon. When employing a TiN liner having a thickness of less than 10 nm, the work function and, hence, the threshold voltage of the transistor may be adjusted by adjusting the thickness of the TiN liner. Generally, if a metal is used, a higher conductivity of the gate electrode may be achieved, in comparison with polysilicon. Moreover, if a metal is used, substantially no depletion of the gate material will take place, if a gate voltage is applied. Accordingly, further capacitances at the interface may be reduced. FIGS. 27A and 27B show exemplary cross-sectional views of a substrate after providing the gate dielectric 525 and the gate conductive material 529. As can be seen, vertical portions 528 of the gate electrodes extend laterally to the fin-like portions formed in the substrate material. The substrate may be further processed in a manner as will be explained later with reference to FIGS. 38 to 40.

Figure 28:
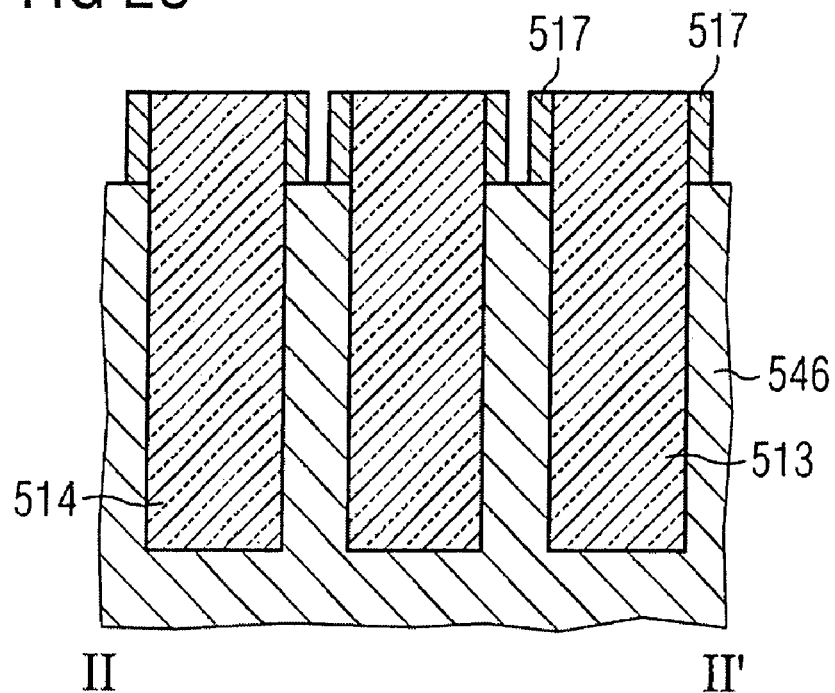
Figure 29:
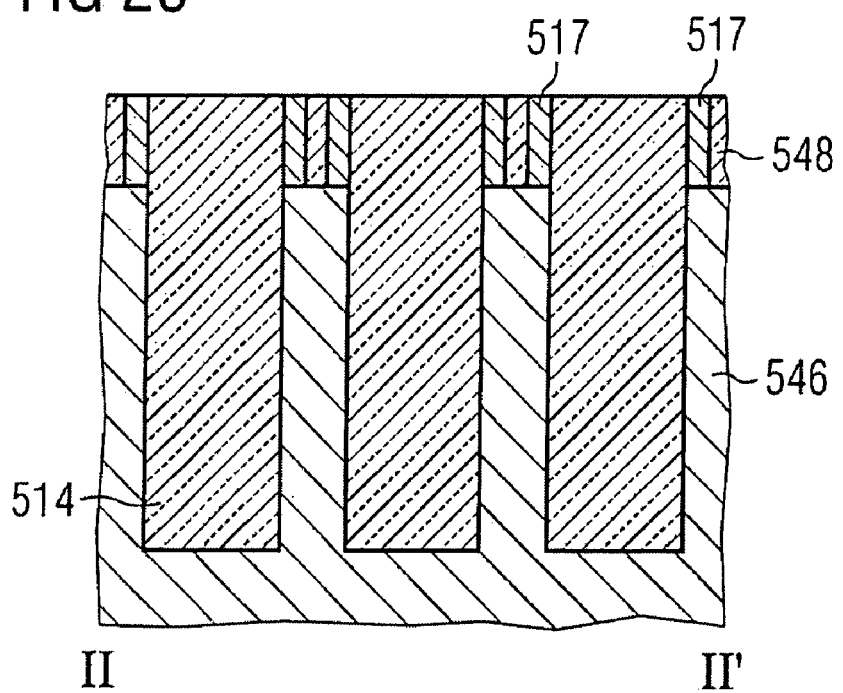

In the next Figures, an alternative embodiment of forming the transistors of the first type in the support portion will be explained. Starting from the structure which is shown in FIG. 19, for example, an anisotropic etching step may be performed so as to remove the horizontal portions of the sacrificial liner 547. As a result, as is shown in FIG. 28, sacrificial spacers 517 may be formed adjacent to the isolation trenches 513. Thereafter, an insulating material 548 such as silicon oxide may be deposited and etched back. As a result, as can be seen from FIG. 29, the insulating material 548 may be disposed between adjacent spacers 517. Thereafter, a photolithographic step is performed in a similar manner as has been explained above with reference to FIG. 23. A photolithographic step employing suitable hard mask layers and photoresist layers 549 is performed so as to open those portions at which the transistors of the first type are to be formed (FIG.

Figure 31A:
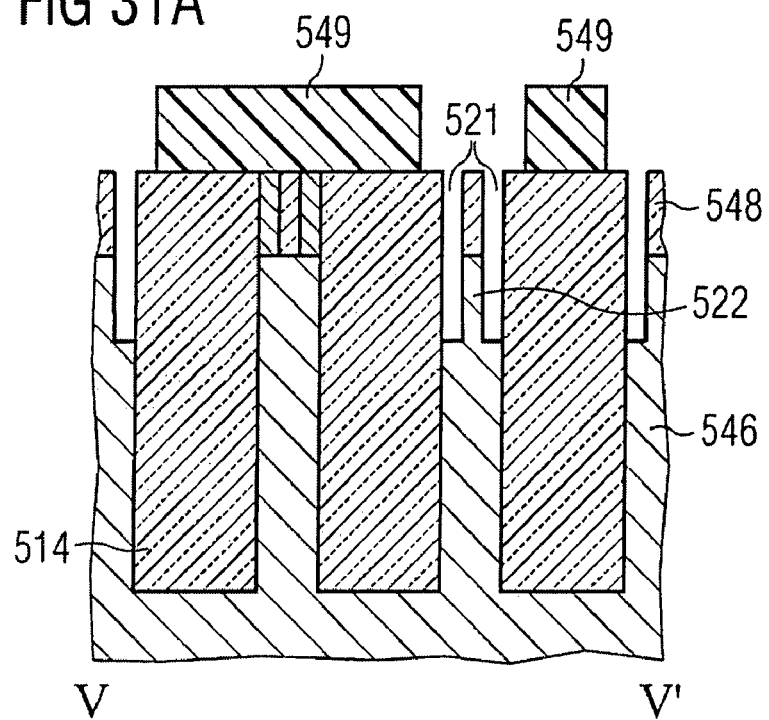
Figure 31B:
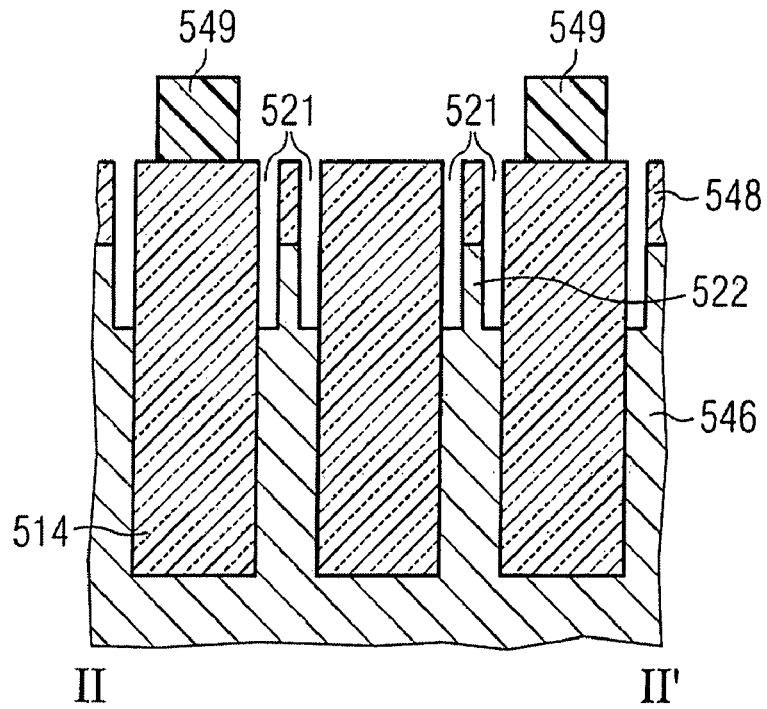

30). After performing the photolithographic step, an etching step is performed so as to remove the sacrificial spacers 517, followed by a step of etching silicon substrate material in the same manner as has been explained above. As a result, as can be seen, from FIGS. 31A and 31B, pockets 521 may be formed in the substrate material 500. Between adjacent pockets 521 fin-like portions 522 may remain. Thereafter, an etching step for etching the insulating material 548 may be performed, followed by a step of removing the remaining portions of the photoresist material and, optionally, the hard mask layers.

Figure 30A:
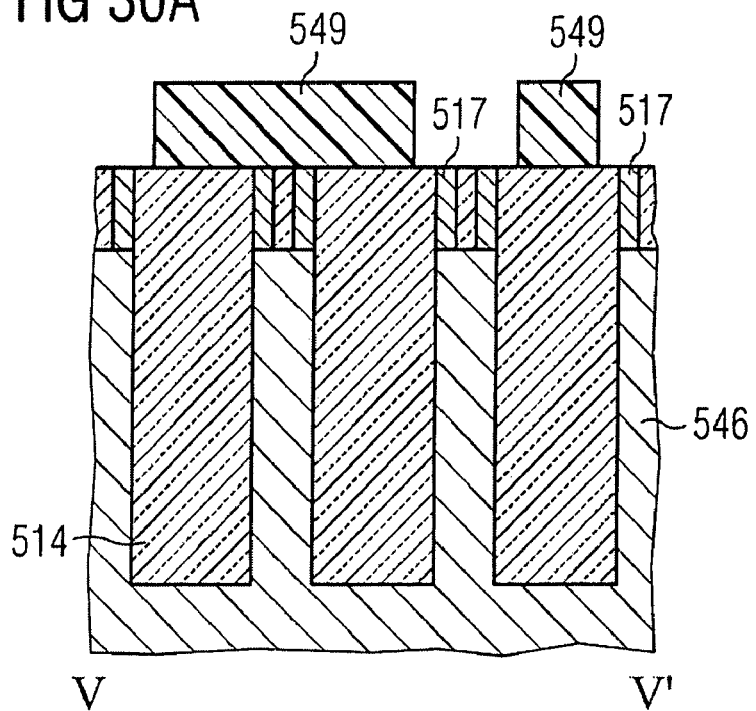
Figure 30B:
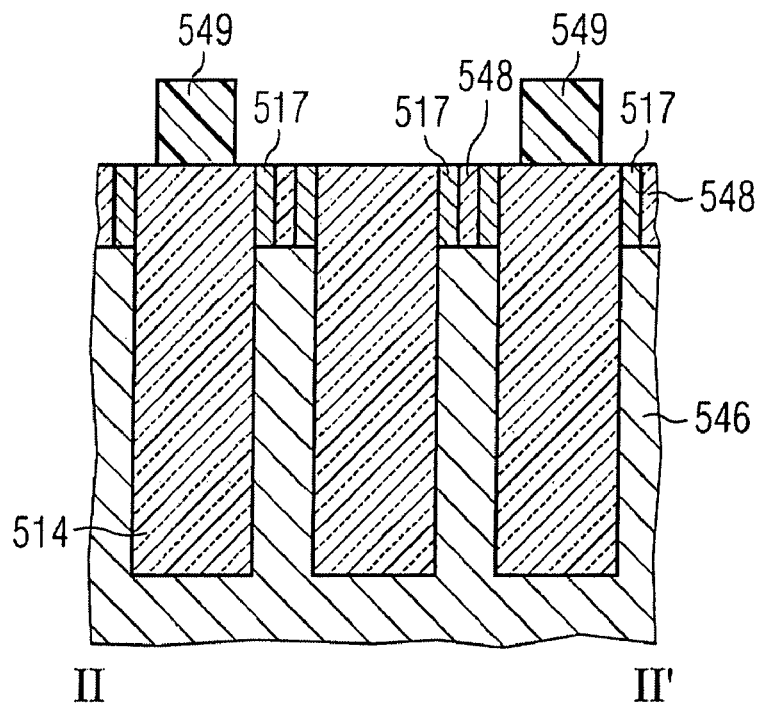
Figure 32A:
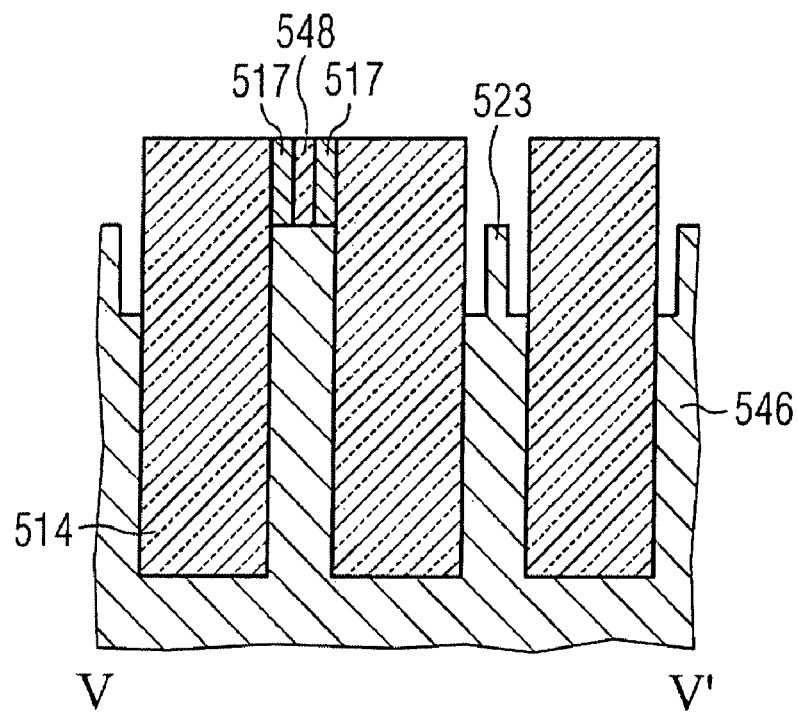
Figure 32B:
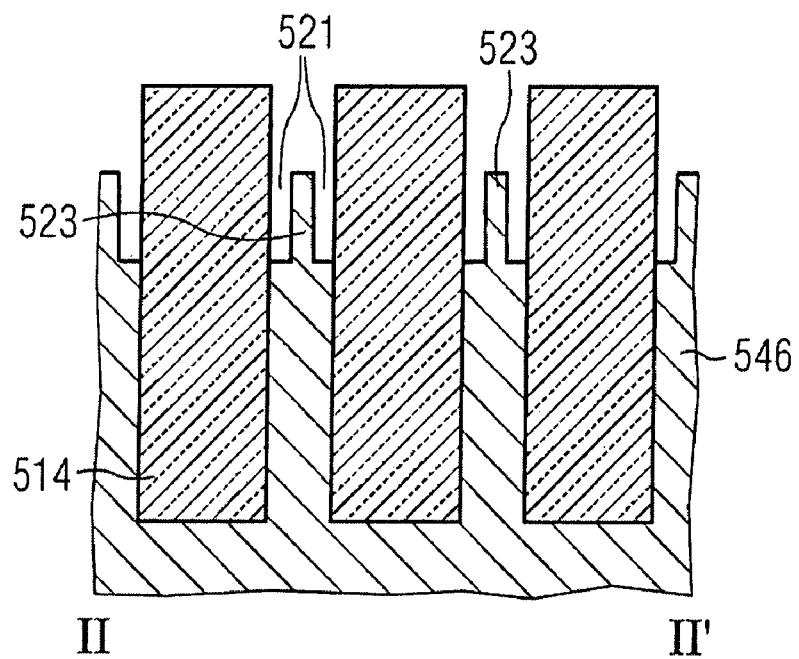

FIGS. 32A and 32B show exemplary cross-sectional views of the substrate after removing the resist material 549. As can be seen, due to the etching of the insulating material, the width of each of the pockets 521 may be widened. Thereafter, an etching step for etching silicon substrate material may be performed. By way of example, this may be a reactive ion etching step. As a result, the surface of the fin-like portions 522 may be recessed with respect to the substrate surface 510. If the material of the sacrificial spacer 517 is polysilicon, the polysilicon spacers 517 will be removed by this etching step as well. FIGS. 33A and 33B show exemplary cross-sectional views of the substrate after this silicon etching step. As can be seen, the surface of each of the fin-like portions 523 is recessed with respect to the substrate surface. Moreover, the pockets 521 may be widened. FIG. 33C illustrates a cross-sectional view between VI and VI' as can be seen from FIG. 30, for example. As can be seen, the pocket 521a is formed in the semiconductor substrate 546.

Optionally, also an annealing step in hydrogen as has been explained above may be performed so as to obtain a fin-like portion having a rounded or circular shape.

Thereafter, optionally, further processing steps may be performed so as to avoid unwanted leakage currents which may arise if the gate electrode is not correctly positioned above the channel portion but overlaps with the source/drain portions. By way of example, a silicon nitride liner 550 may be deposited and anisotropically etched back so as to form side wall spacers. To be more specific, the silicon nitride liner 550 is deposited so as to fill the gate grooves as well as the pockets 521 formed in the substrate portion and, optionally, in the isolation trenches. Exemplary cross-sectional views of the resulting substrate ere shown in FIGS. 34A and 34B. For example, FIG. 34A shows a cross-sectional view between V and V whereas FIG. 34B shows a cross-sectional view between II and II. As can be seen, the lower part of each of the pockets 521 now is filled with silicon nitride material 550, leaving an upper portion of the fin-like portion 523 uncovered. The upper surface of the silicon nitride material may be disposed below the upper surface of the fin-like portion 523. Moreover, FIG. 34C shows a cross-sectional view between VI and VI. As can be seen, the lower portion of each of the gate grooves 521 now is filled with silicon nitride material 550. As can further be seen from FIG. 34B showing a cross-sectional view between II and II', the fin-like portion 523 is not covered with silicon nitride.

Figure 35A:
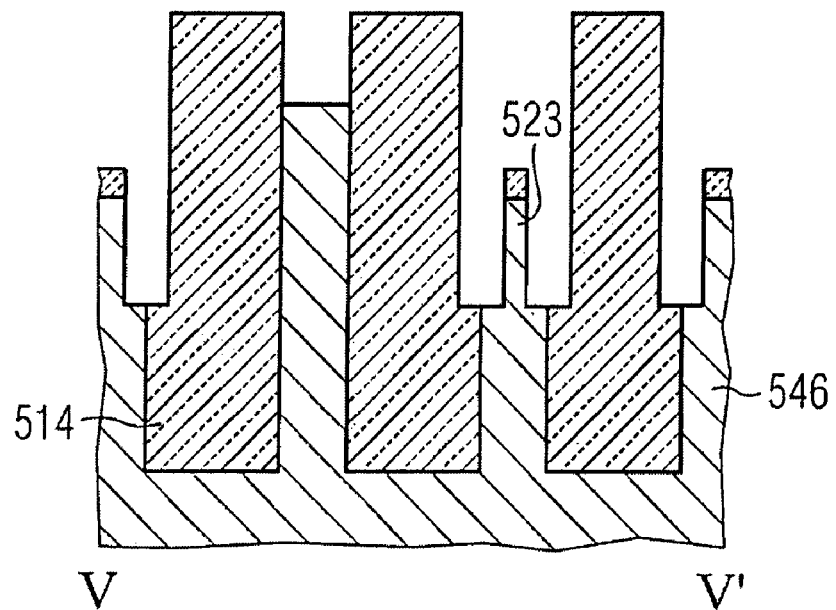
Figure 35B:
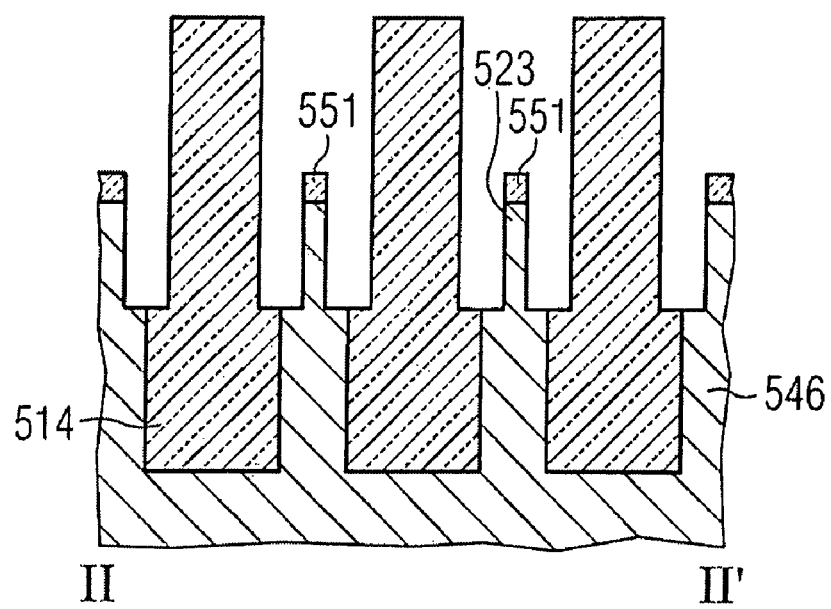
Figure 35C:
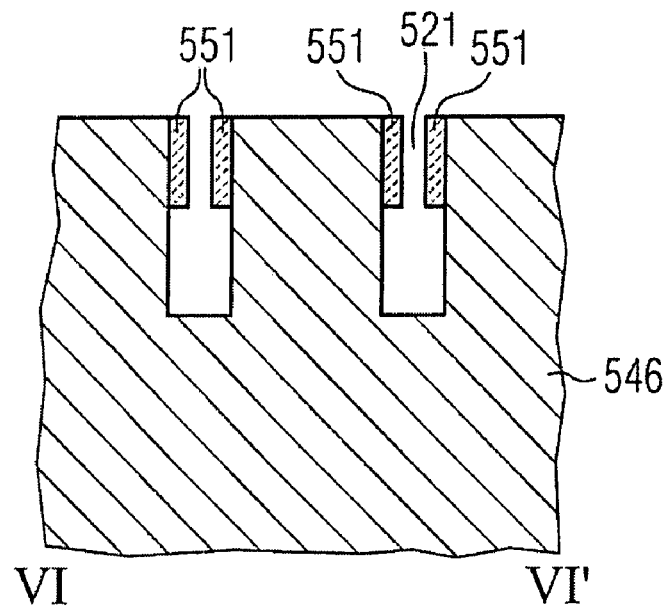
Figure 35D:
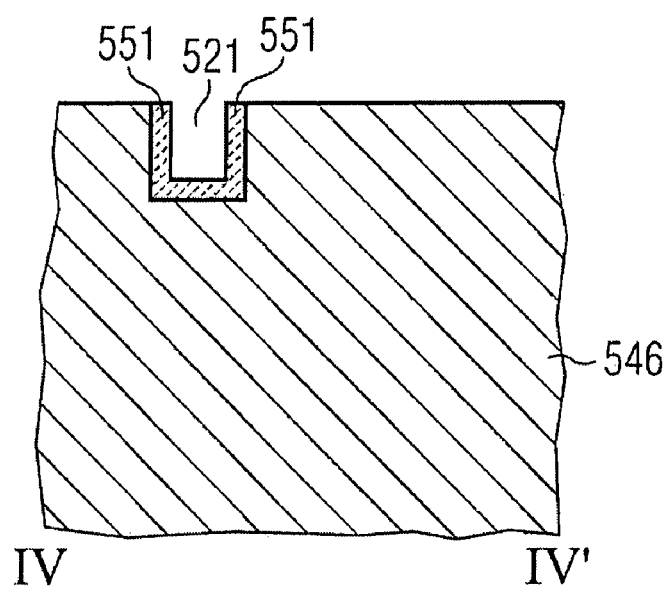
Figure 36B:
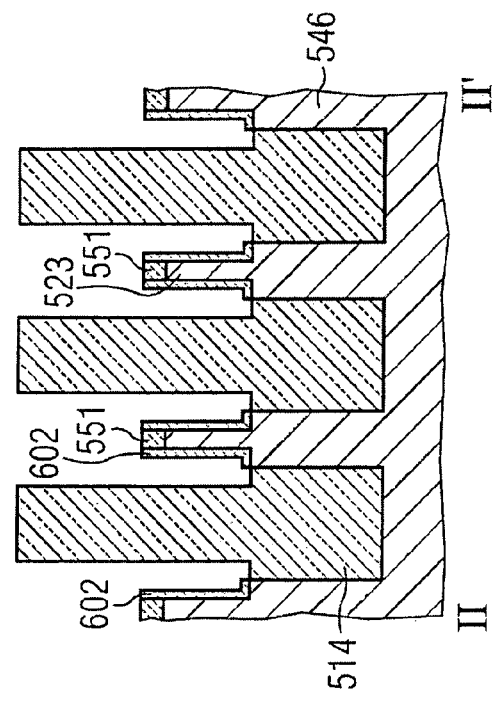
Figure 36A:
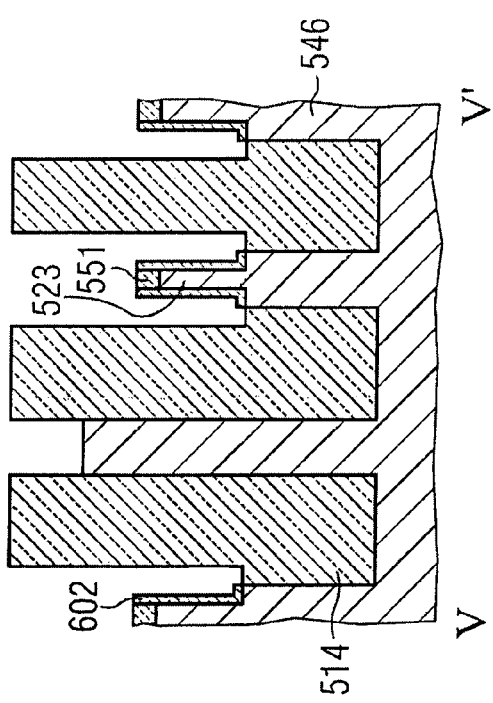
Figure 36C:
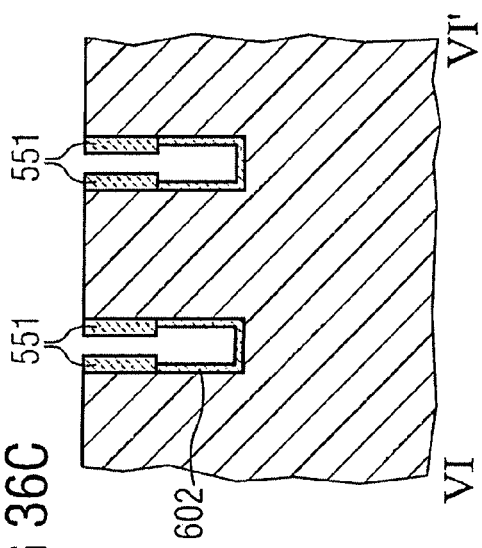

Thereafter, an oxidation step is performed at those positions which are not covered with the silicon nitride layer 550. Accordingly, as can be seen from FIGS. 35A and 35B, the topmost portion of the fin-like portion 523 is covered with a silicon oxide layer 551. Moreover, as can be seen from FIG. 35C side wall spacers made of silicon oxide 551 are formed in the upper portions of the gate grooves. In addition, as can be seen from FIG. 35D, a central portion of the gate groove is entirely covered with the silicon oxide layer 551. Thereafter, an oxidation step may be performed so as to provide a silicon oxide layer forming the gate dielectric layer 602. Cross-sectional views of an exemplary semiconductor substrate are shown in FIGS. 36A to 36C. As can be seen from FIGS. 36A to 36C, the thickness of the silicon oxide layer 551 may be thicker than the gate dielectric layer 502. Thereafter, a suitable gate conductive material is deposited. By way of example, a polysilicon layer 501 may be deposited. As an alternative, any other suitable metal layer or metal layer stack or combination of conductive metal layers and conductive non-metal layers may be used in the same manner as has been explained above.

Figure 37B:
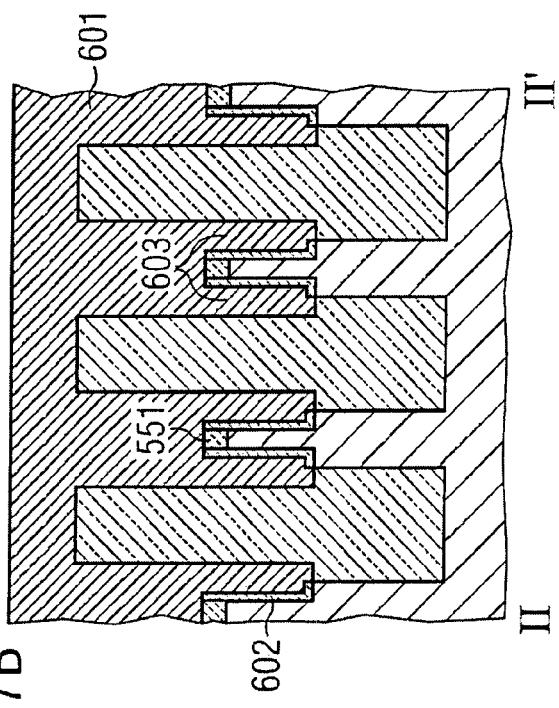
Figure 37A:
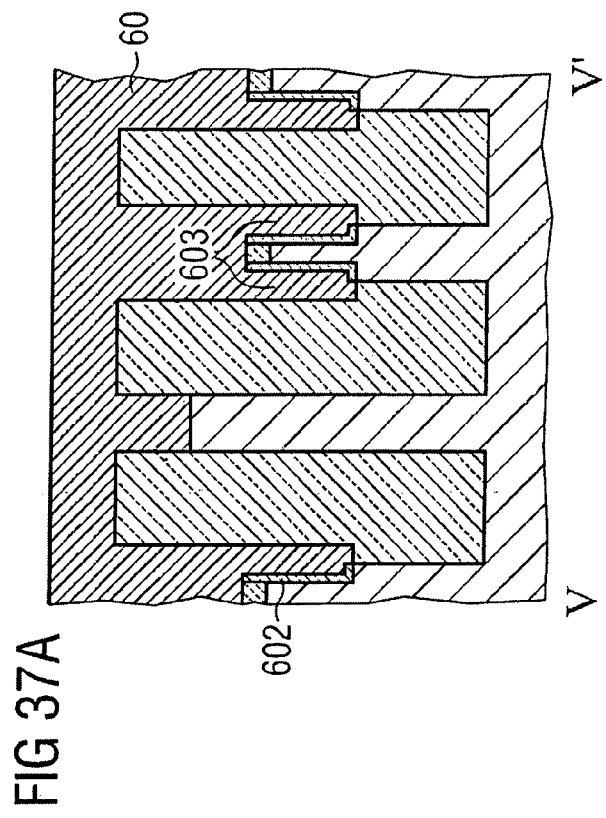
Figure 37C:
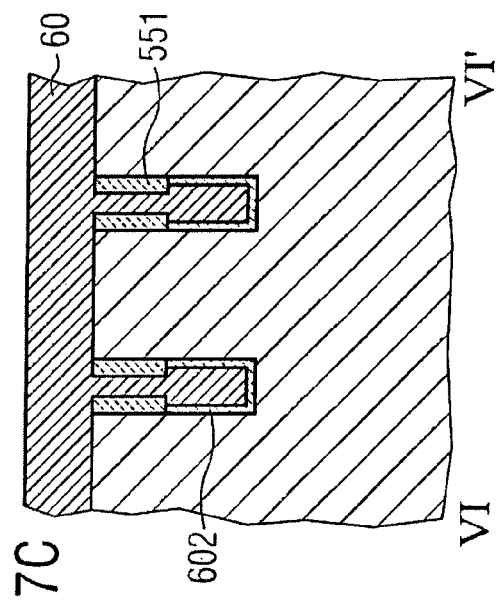

FIGS. 37A to 37C show cross-sectional views of an exemplary substrate. As can be seen, the silicon oxide layer 551 has a larger thickness in the central groove portion than the gate dielectric layer 602 which is present between the vertical portions of the gate electrode and the fin-like portion 522. Accordingly, depending on the thickness of the silicon oxide layer 551 present in the central groove portion as is shown in FIG. 37B, for example, the gate electrode 601 may be formed so as to form only a double-gate electrode, for example, a game electrode which is adjacent to two sides of the channel of the transistor. In this case, the horizontal portions of the gate electrode may hardly influence the conductivity of the channel. If the thickness of the gate dielectric layer 602 in the central portion of the groove has the same thickness as the gate dielectric adjacent to the vertical portions of the gate electrode 603, the gate electrode is referred to a triple gate electrode. The cross-sectional view of FIG. 37C is taken between VI and VI'.

Thereafter, the resist layer may be removed from the array portion and further processing steps for forming the capacitor may be performed. The next figures illustrate an exemplary process flow starting from the structure shown in FIG. 27, i.e. a substrate, in which the surface of the fin-like portions 522 has not been recessed with respect to the surface 500 of the semiconductor, substrate.

Figure 38A:
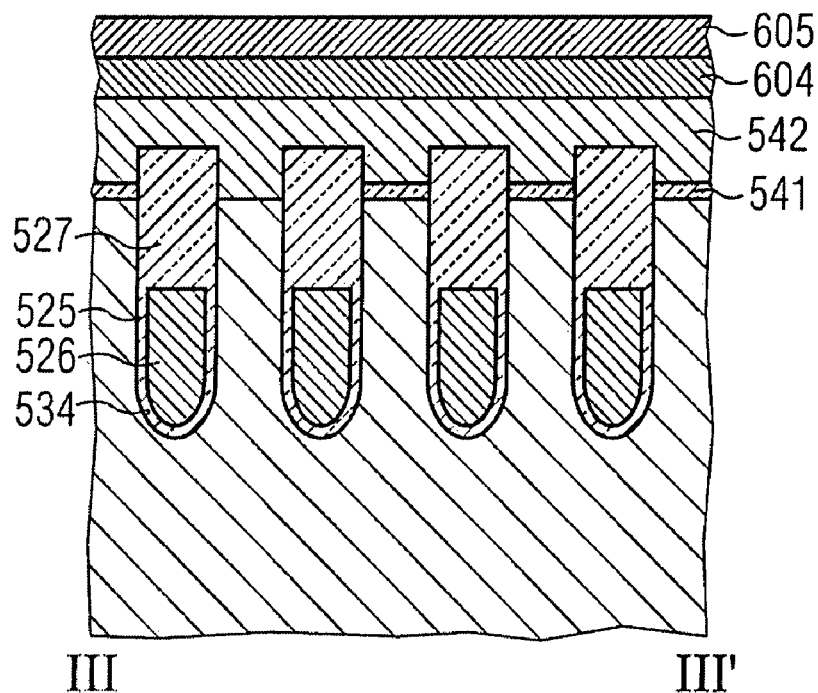
Figure 38B:
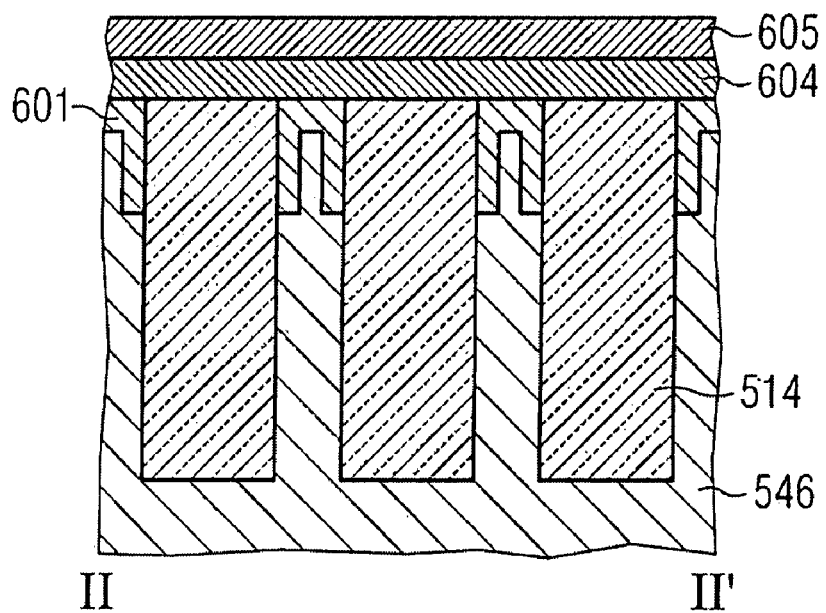
Figure 39A:
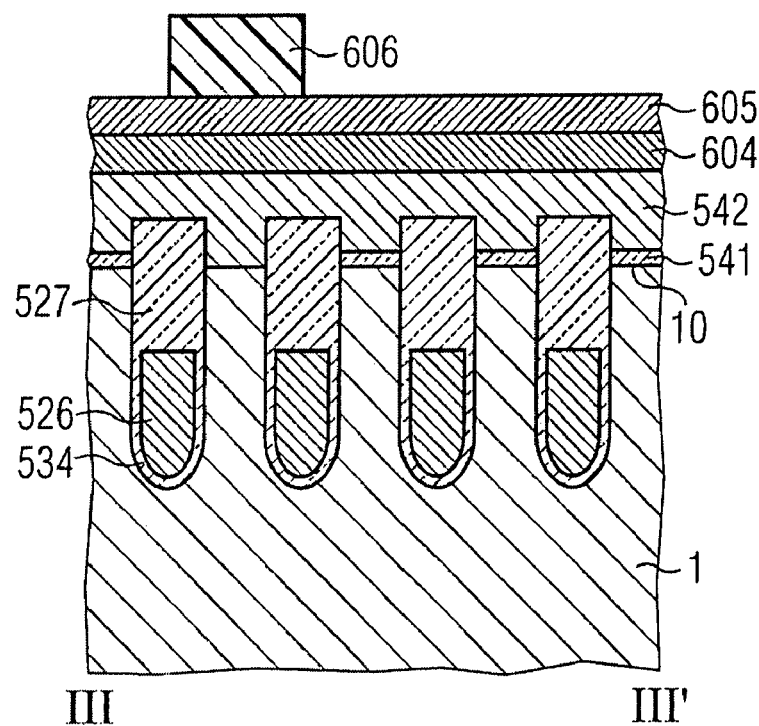
Figure 39B:
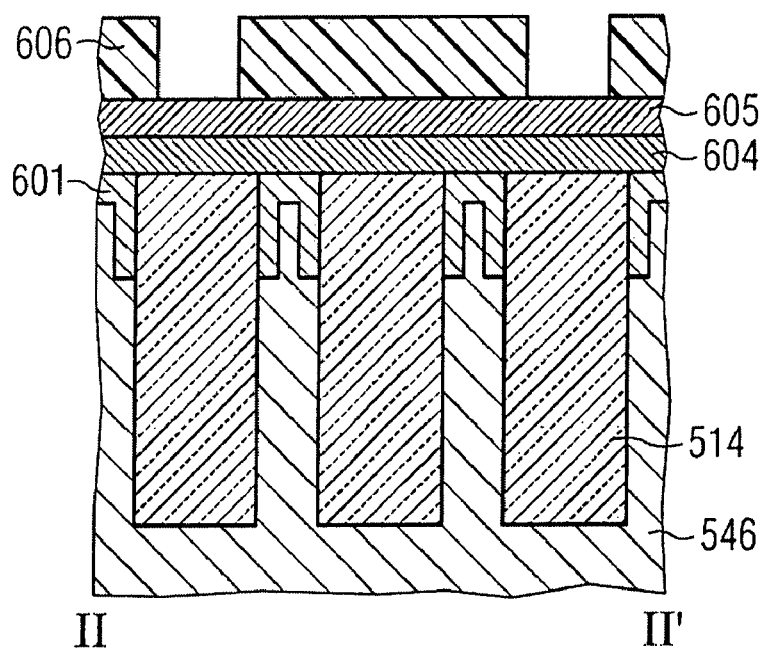

By way of example, conductive layers may be deposited over the whole semiconductor substrate. The layers to be deposited may form the bit lines in the array portion and gate electrodes and, optionally, conductive lines in the periphery portion. By way of example, a titanium layer may be deposited, followed by a tungsten layer 604. Thereafter, a silicon nitride layer 600 may be deposited. Nevertheless, it is clearly to be understood, any other combination of materials may be used. A cross-sectional view of an exemplary substrate is shown in FIGS. 38A and 38B. For example, FIG. 38A shows a cross-sectional view between III and III of the array portion, whereas FIG. 38B shows a cross-sectional view between II and II in the support portion.

Figure 40A:
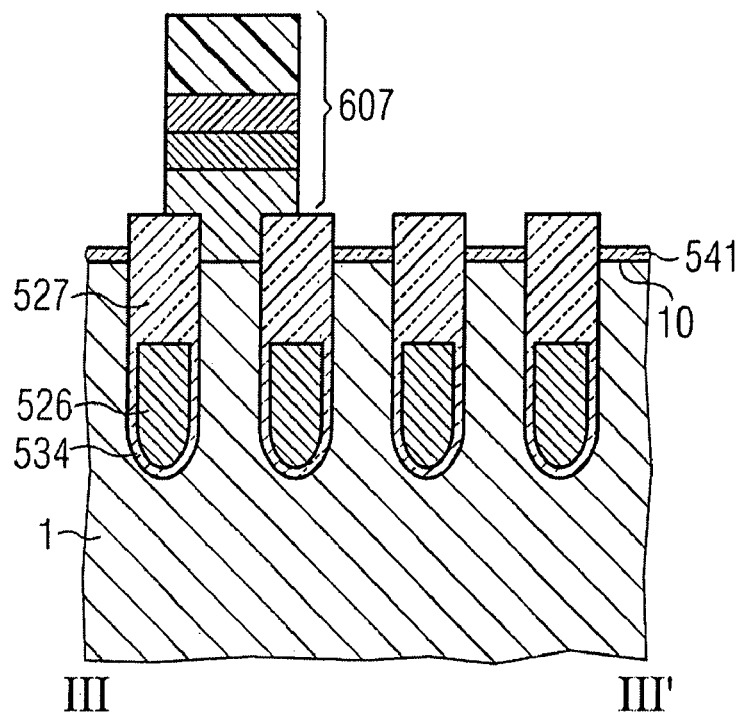
Figure 40B:
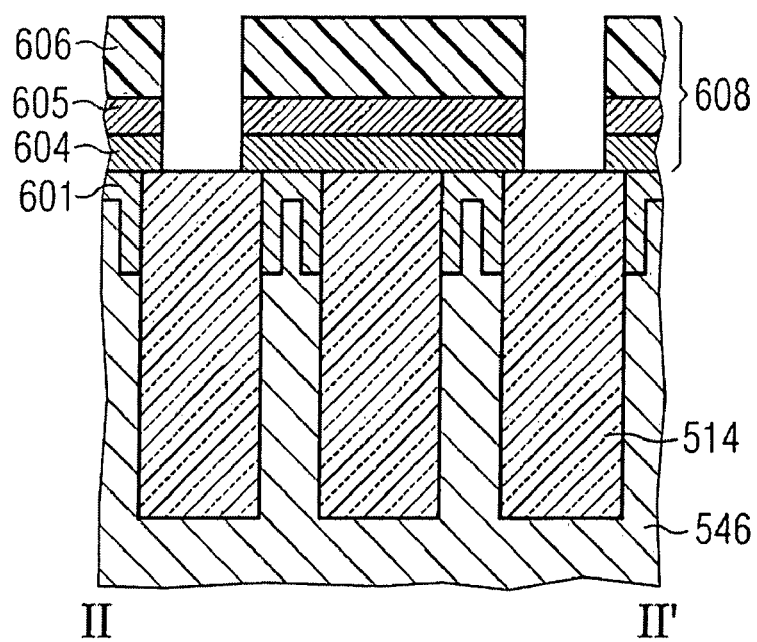
Figure 41A:
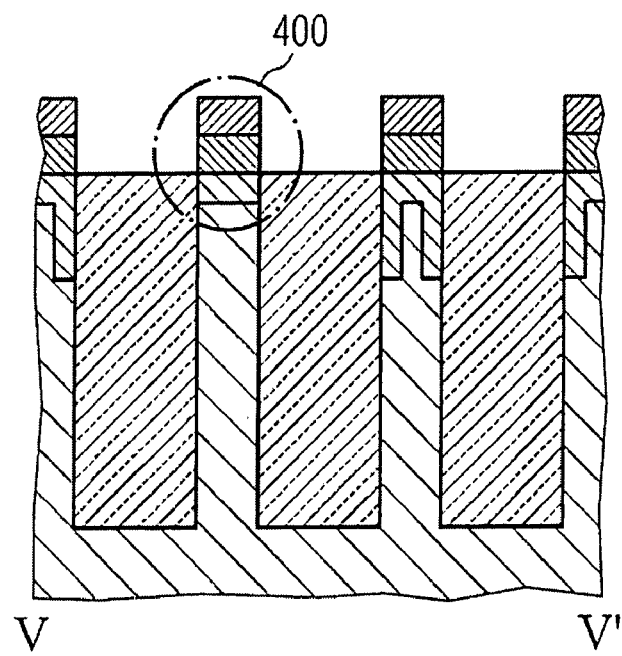
Figure 41B:
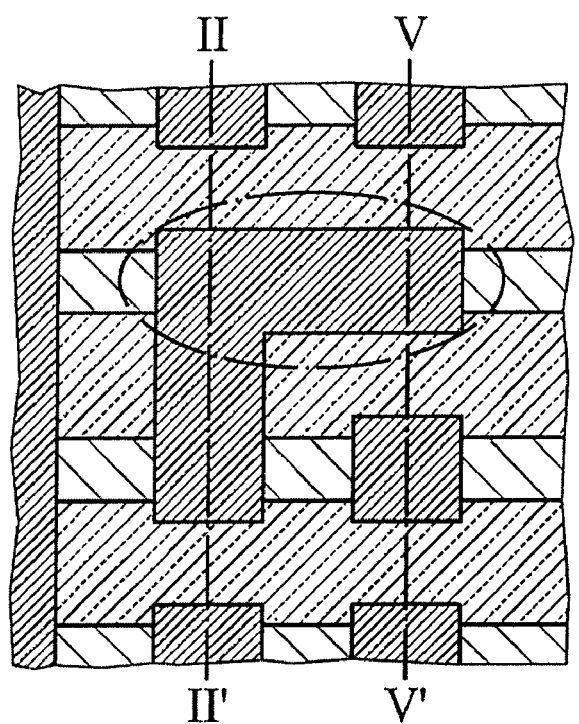

Then, bit lines may be photolithographically patterned in the array portion and, at the same time, gate electrodes may be patterned in the support portion. Accordingly, a photolithographical mask comprising corresponding patterns in the array portion as well as in the support portion may be used. A photoresist layer 606 and, optionally, several hard mask layers (not shown) may be used for patterning the conductive layer stack comprising the polysilicon layer 542, the metal layer 604 and the silicon nitride layer 605. As has been explained above, the photomask may comprise patterns for defining the bit lines and the gate electrodes in the support portion. After correspondingly patterning the photoresist layer 606 as is shown as an example, in FIGS. 39A and 39B, an etching step is performed for patterning the conductive layer stack. A cross-sectional view of the resulting structure is exemplarily shown in FIGS. 40A and 40B. As can be seen, now, in the array portion, between III and III, a bit line 607 is patterned (FIG. 40A). Moreover, in the peripheral portion, a peripheral conductive line 608 is patterned, as can be seen from FIG. 40B. Thereafter, the remaining portion of the photoresist layer 606 are removed. As a consequence, as is shown in FIG. 41A, for example, a planar transistor 400 is formed in the support portion. FIG. 41B shows a plan view on an exemplary resulting substrate.

Figure 41D:
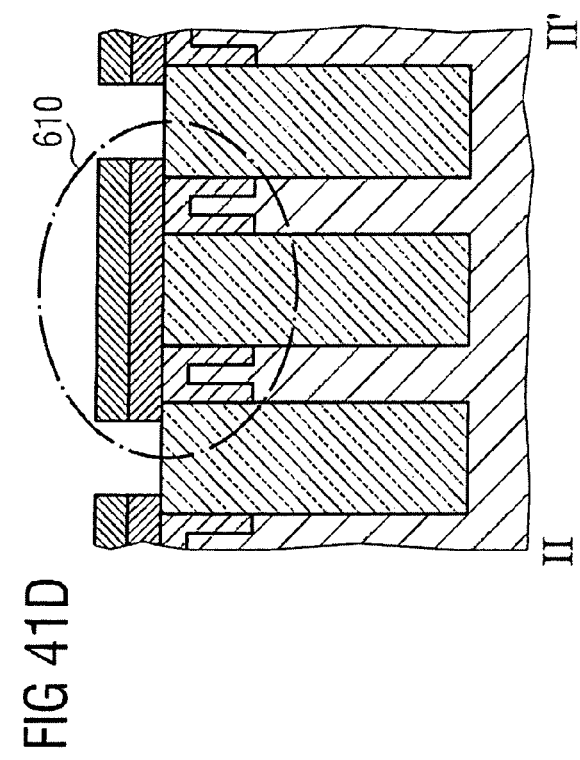
Figure 41C:
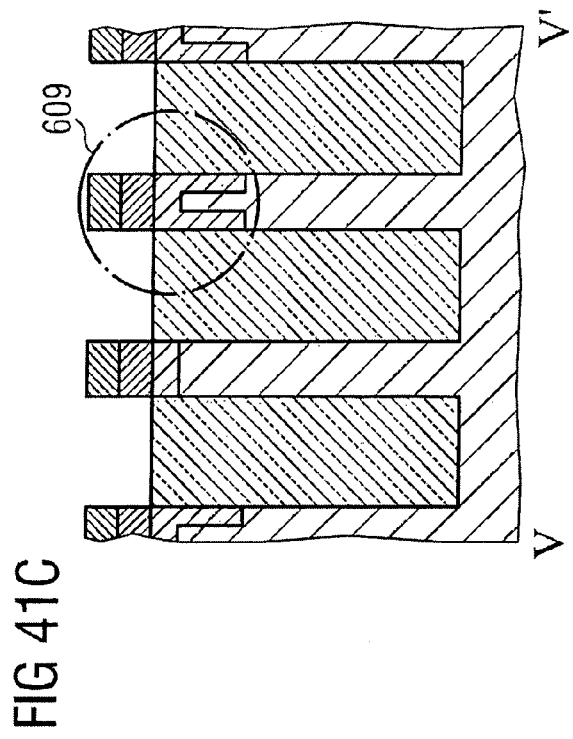

As is further shown in FIG. 41C, the FinFet 609 is formed in the support portion.

Figure 41E:
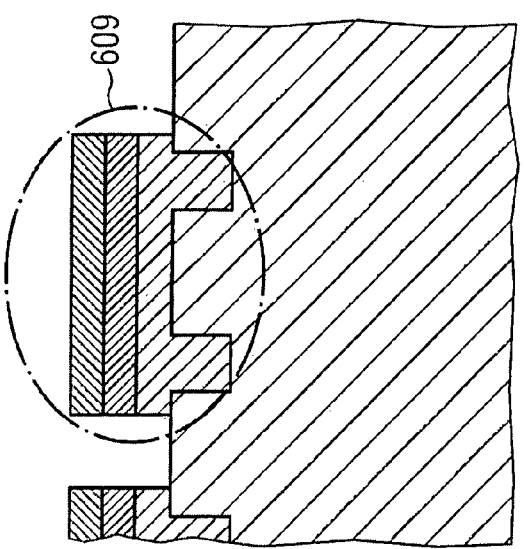

Moreover, as can be seen from FIGS. 41D and 41E, a multi finFET is formed in the support portion.

Thereafter, various processing steps which are commonly used for processing memory devices are performed. For example, first, an oxide spacer 613 is formed in the peripheral portion as is common. Thereafter, implantation steps are performed so as to provide the source/drain portions of the transistors in the peripheral portion. By way of example, the array portion may be protected by a suitable block mask during these implantation steps.

Thereafter, a further silicon oxide layer forming a barrier layer is formed, followed by the deposition of a sacrificial polysilicon layer 614. A CMP step is performed, so that the resulting surface of the polysilicon layer 614 is located approximately 100 to 300 nm above the surface of the cap layer 605. Thereafter, a further hard mask layer, for example, a silicon oxide layer is deposited and the capacitor contacts of the capacitors to be formed in the array portion are photolithographically defined. By way of example, this may be accomplished using a mask having a line/spaces pattern. Thereafter, the hard mask is correspondingly etched so as to define an etching mask for etching the polysilicon layer 614. After etching the polysilicon layer 614, first, a silicon oxide liner 613 is deposited and etched so as to form silicon, oxide spacers. Thereafter, further implantation steps are performed so as to provide the source/drain portions in the array portion. For example, the support portion may be protected by a suitable block mask during these implantation steps.

Figure 42A:
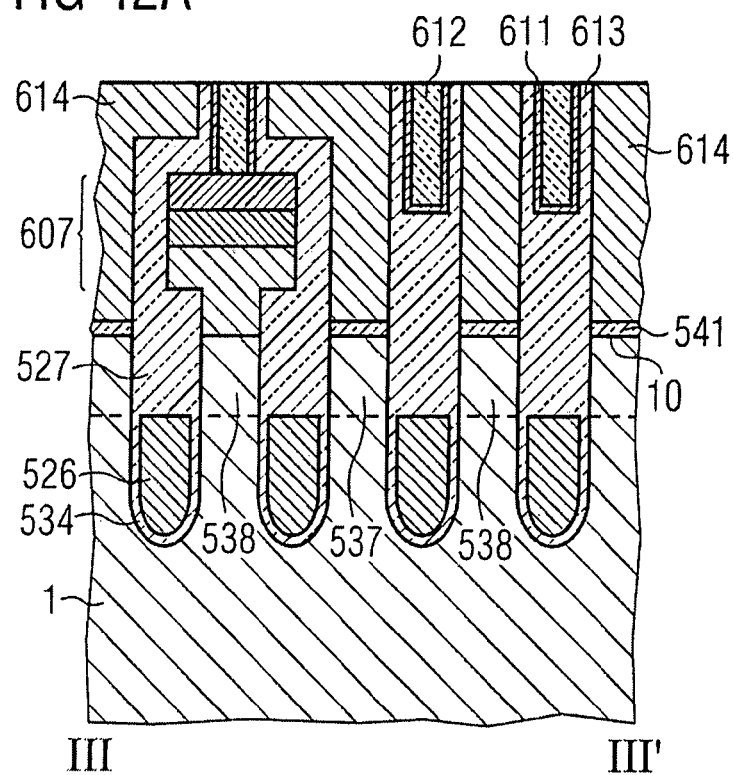
Figure 42B:
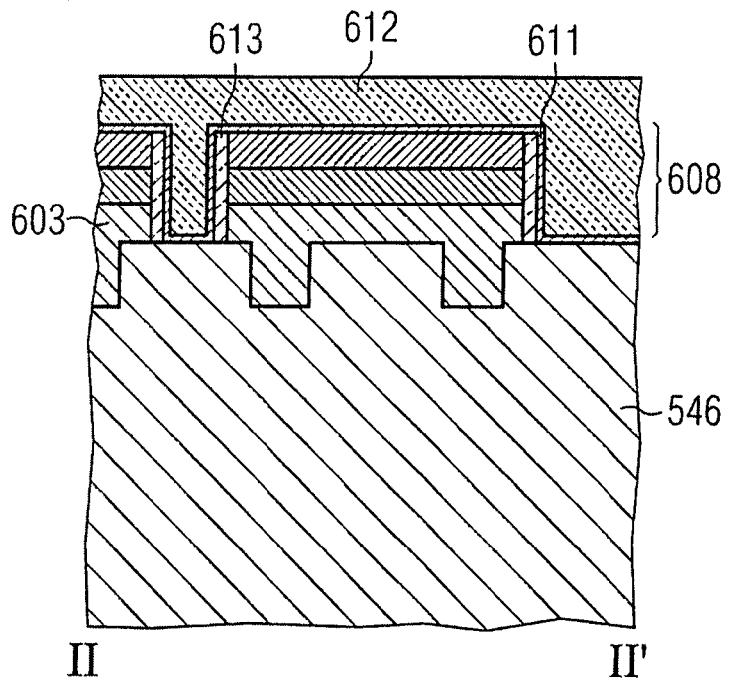
Figure 43:
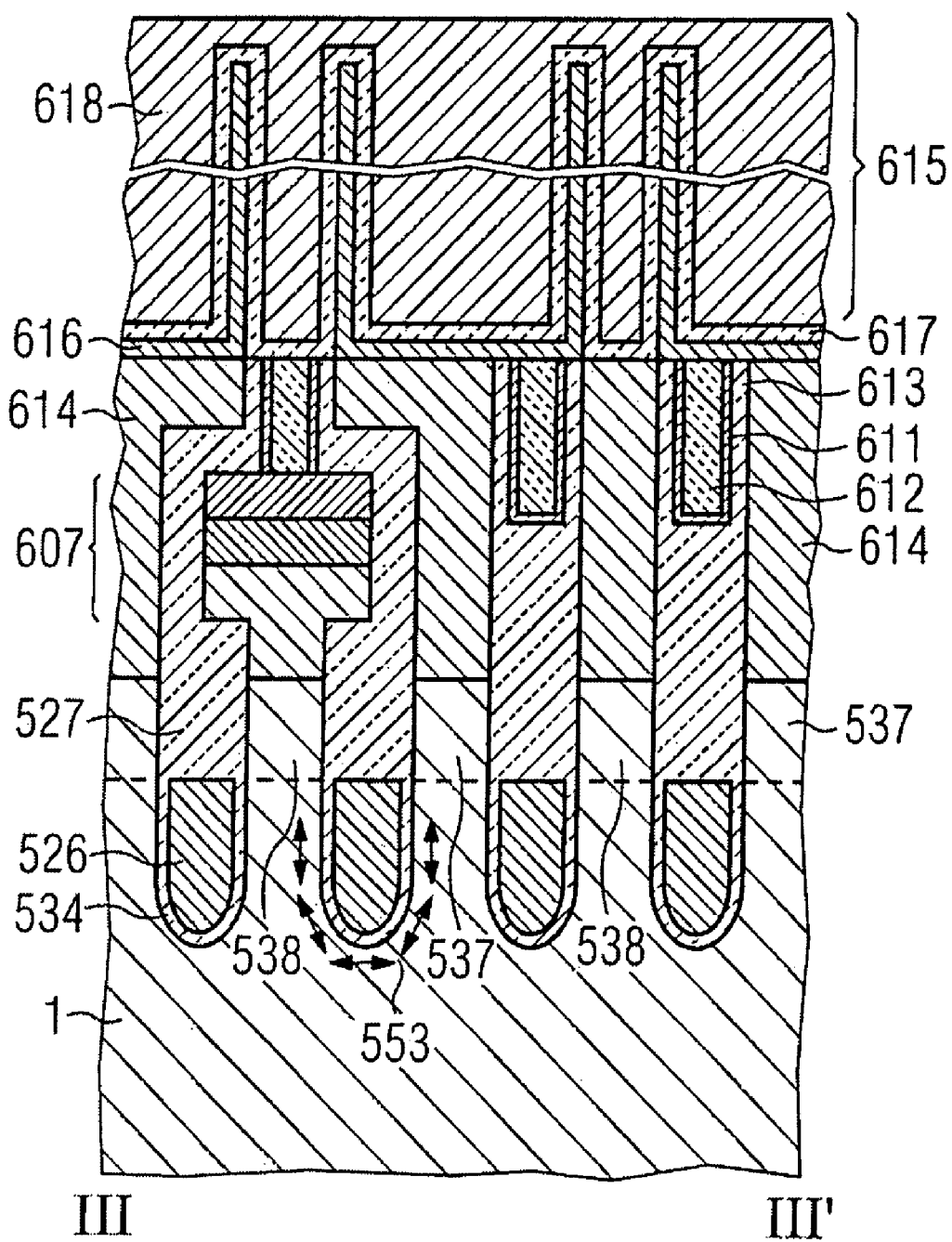
FIG. 43 shoves a cross-sectional view of the array portion of an integrated circuit after performing steps according to an embodiment.

Furthermore, a silicon nitride layer 611 may be deposited, followed by a BPSG layer 612. A cross-sectional view of an exemplary substrate is shown in FIGS. 42A and 42B. For example, as can be seen from FIG. 42A, now a BPSG plug 612 may be formed above the buried word lines 526 and above the bit lines 607 in the array portion. Moreover, the support portion is covered with a BPSG layer 612 at those positions, at which the gate electrode or the conductive lines 608 are not formed. Thereafter, the sacrificial polysilicon layer 614 is removed from the array portion. Then, the oxide barrier layer 541 is etched so as to expose the substrate portions above the second source/drain portions. Then, a suitable conductive material, for example a further polysilicon layer, is deposited so as to be in contact with the second source/drain portions 537, 538. This conductive material may act as a capacitor contact 614. After a further CMP step, the further components of the storage capacitor are provided. By way of example, the first capacitor electrode, a suitable capacitor dielectric as well as the second capacitor electrode may be deposited in a manner as is conventional. FIG. 43 shows by way of example a cross-sectional view of a substrate comprising a storage capacitor 615 comprising a first capacitor electrode 616, a capacitor dielectric 617 and a counter electrode 618.

The first capacitor electrode 616 is connected via the capacitor contact 614 with the first source/drain portion 537. The channel 553 is formed between the first and the second source/drain portion 537, 538. The conductivity of the channel 553 is controlled by the gate electrode 526. Upon activation of a specific memory cell by selecting a corresponding word line, a voltage is applied to the gate electrode 532, and the corresponding transistor is set to a conductive state. Accordingly, an information stored in the storage capacitor 615 is transmitted via the capacitor contact to the first source/drain portion 537 and via the channel 553 to the second source/drain portion 538 to the corresponding bit line 607. Accordingly, the information stored in the memory cell may be transmitted via the corresponding bit lane 607 and may be transmitted to the support portion in which the respective transistors of the second type may be present.

The invention claimed is:

1. A method of manufacturing an integrated circuit including a memory device, comprising
defining an array portion comprising forming memory cells and forming conductive lines, and
defining a support portion comprising forming transistors of a first type, wherein forming the conductive lines comprises defining grooves in a semiconductor substrate and filling the grooves with a conductive material, and wherein forming transistors of the first type comprises defining vertical portions that are vertically adjacent to a channel of the transistor of the first type.

2. The method of claim 1, further comprising recessing a substrate portion adjacent to the vertical portions.

3. The method of claim 2, wherein defining the vertical portions is accomplished before recessing the substrate portion.

4. The method of claim 1, wherein defining the vertical portions comprises etching the semiconductor substrate.

5. The method of claim 1, wherein defining the vertical portions comprises etching an insulating material that is disposed in isolation trenches that are adjacent to the semiconductor substrate.

6. The method of claim 1, further comprising defining isolation trenches that are adjacent to the semiconductor substrate, wherein the vertical portions are defined in a self-aligned manner with respect to the position of the isolation trenches.

7. The method of claim 6, wherein after defining the isolation trenches part of a material filling the isolation trenches protrudes from the isolation trenches, wherein defining the vertical portions comprises providing spacers of a sacrificial material adjacent to the protruding material.

8. The method of claim 7, wherein the sacrificial material is silicon nitride.

9. The method of claim 1, wherein providing the memory cells comprises providing transistors of a second type, comprising providing a second gate electrode, wherein providing the second gate electrode comprises defining a gate groove in the semiconductor substrate.

10. The method of claim 1, further comprising providing a planar transistor comprising a gate electrode which is formed above the semiconductor substrate.

* * * * *